United States Patent
Kalnitsky et al.

(10) Patent No.: US 9,799,625 B2
(45) Date of Patent: Oct. 24, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Alexander Kalnitsky, San Francisco, CA (US); Yi-Yang Lei, Taichung (TW); Hsi-Ching Wang, Taoyuan (TW); Cheng-Yu Kuo, Kaohsiung (TW); Tsung Lung Huang, Tainan (TW); Ching-Hua Hsieh, Hsinchu (TW); Chung-Shi Liu, Hsinchu (TW); Chen-Hua Yu, Hsinchu (TW); Chin-Yu Ku, Hsinchu (TW); De-Dui Liao, Hsin-Chu (TW); Kuo-Chio Liu, Hsinchu (TW); Kai-Di Wu, Tainan (TW); Kuo-Pin Chang, Tainan (TW); Sheng-Pin Yang, Kaohsiung (TW); Isaac Huang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/738,109

(22) Filed: Jun. 12, 2015

(65) Prior Publication Data
US 2016/0365332 A1    Dec. 15, 2016

(51) Int. Cl.
*H01L 21/78* (2006.01)
*H01L 23/00* (2006.01)

(52) U.S. Cl.
CPC .............. *H01L 24/83* (2013.01); *H01L 21/78* (2013.01); *H01L 24/73* (2013.01); *H01L 24/92* (2013.01);
(Continued)

(58) Field of Classification Search
CPC ......... H01L 29/02; H01L 29/84; H01L 29/86; H01L 33/00; H01L 23/00; H01L 21/78;
(Continued)

(56) References Cited

U.S. PATENT DOCUMENTS 8,759,989 B2    6/2014 Matsumura et al.
9,070,729 B2    6/2015 Ji et al.
(Continued)

FOREIGN PATENT DOCUMENTS

KR    2012-0112091 A    10/2012
KR    2013-0096644 A    8/2013
KR    2015-0037146 A    4/2015

OTHER PUBLICATIONS

Office Action of the corresponding German application 10 2015 110 019.3 dated Nov. 20, 2015.
(Continued)

*Primary Examiner* — Chuong A Luu
(74) *Attorney, Agent, or Firm* — WPAT, P.C., Intellectual Property Attorneys; Anthony King

(57) ABSTRACT

A method of manufacturing a semiconductor structure, comprising: receiving a first substrate including a first surface, a second surface opposite to the first surface and a plurality of conductive bumps disposed over the first surface; receiving a second substrate; disposing an adhesive over the first substrate or the second substrate; heating the adhesive in a first ambiance; bonding the first substrate with the second substrate by applying a force of less than about 10,000N upon the first substrate or the second substrate and heating the adhesive in a second ambiance; and thinning down a thickness of the first substrate from the second surface.

20 Claims, 23 Drawing Sheets

(52) U.S. Cl.
CPC ...... *H01L 24/94* (2013.01); *H01L 2224/2919* (2013.01); *H01L 2224/73204* (2013.01); *H01L 2224/8385* (2013.01); *H01L 2224/83201* (2013.01); *H01L 2224/921* (2013.01); *H01L 2924/06* (2013.01); *H01L 2924/07025* (2013.01)

(58) Field of Classification Search
CPC ......... H01L 21/48; H01L 21/44; H01L 21/50; H01L 21/76; H01L 21/768; H01L 24/73; H01L 24/83; H01L 2224/83201; H01L 2224/8385; H01L 2224/921; H01L 2924/01078; H01L 2924/01079; H01L 2924/01029; H01L 2924/01013
USPC .......................................................... 438/113
See application file for complete search history.

(56) References Cited

U.S. PATENT DOCUMENTS

| | | |
|---|---|---|
| 2003/0166313 A1 | 9/2003 | Nishikawa et al. |
| 2004/0029316 A1 | 2/2004 | Schnegg et al. |
| 2007/0141330 A1* | 6/2007 | Morishima ......... H01L 21/6835 428/343 |
| 2009/0218560 A1 | 9/2009 | Flaim et al. |
| 2011/0111560 A1* | 5/2011 | Purushothaman ......... H01L 21/76898 438/109 |
| 2012/0208350 A1* | 8/2012 | Oda ...................... H01L 21/568 438/465 |
| 2015/0086446 A1* | 3/2015 | Saito ................. B01L 3/502707 422/503 |
| 2015/0093880 A1* | 4/2015 | Ji ...................... H01L 21/02013 438/459 |

OTHER PUBLICATIONS

Office Action of the corresponding Korean application 10-2015-0118898 dated May 4, 2016.
English translation of the Office Action of the corresponding Korean application 10-2015-0118898 dated May 4, 2016.
KR 2015-0037146 corresponds to U.S. Pat. No. 9,070,729.
KR 2013-0096644 corresponds to U.S. Pat. No. 8,759,989.
Notice of Allowance of the corresponding Korean application 10-2015-0118898 dated Dec. 1, 2016.
English translation of the Notice of Allowance of the corresponding Korean application 10-2015-0118898 dated Dec. 1, 2016.

* cited by examiner

SEMICONDUCTOR STRUCTURE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

The major trend in the electronic industry is to make the semiconductor device smaller and more multifunctional. The semiconductor device comprises an electrical interconnection structure for electrically connecting a number of metallic structures between adjacent layers of the semiconductor device so as to minimize the final size of the semiconductor device as well as the electronic equipment. In a field of microelectronics as well as three-dimensional wafer level integration, a technology of wafer bonding is applied to support the dense and multifunctional semiconductor device. The semiconductor device includes two or more wafers which are bonded together by different principles such as direct bonding or interlayer bonding.

As technologies evolve, design of the devices becomes more complicated in view of small dimension as a whole and increase of functionality and amounts of circuitries. The devices involve many complicated steps and increases complexity of manufacturing. Numerous manufacturing operations are implemented within such a small and high performance semiconductor device. An increase in a complexity of manufacturing the semiconductor device may cause deficiencies such as poor coplanarity of bonded wafers, poor reliability of the electrical interconnection, development of cracks within components, and high yield loss. Thus, there is a continuous need to modify the method for manufacturing the semiconductor device in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
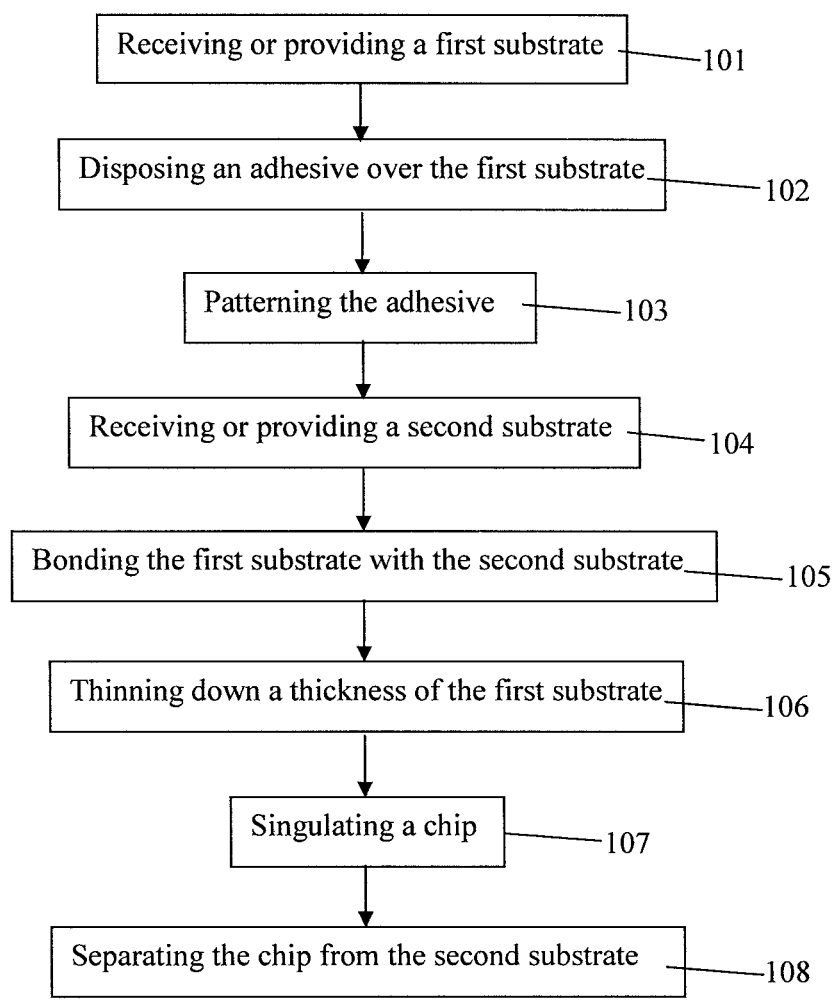
FIG. 1 is a flow diagram of a method of manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device commonly involves substrate, and the substrate is fabricated to include several circuitries thereon. During fabrication of the substrate, the substrate is handled by a carrier wafer. The substrate is temporarily bonded with the carrier wafer so as to facilitate a manipulation of the substrate. After bonding the substrate with the carrier wafer, the substrate is processed by several operations such as thinning, lithography, deposition, etching, etc. After completion of necessary processes, the substrate is separated from the carrier wafer and transported to integrate with other devices or circuitries.

Since semiconductor device is becoming smaller and smaller in size, the substrate requires thinning down its thickness during fabrication. During the thinning operations, some of the substrate are removed by any suitable operations such as grinding. A grinding force usually performs as a torque or shear applied over a surface of the substrate in order to remove some of the substrate and thus reduce the thickness of the substrate. However, the substrate is temporarily bonded with the carrier wafer. The substrate is readily released from the carrier wafer after the fabrication. As such, a bonding between the substrate and the carrier wafer may not be able to resist the grinding force acting on the substrate. As a result, the substrate is easily delaminated from the carrier wafer during the thinning operations. The substrate would be impaired and would lead to failure of the semiconductor device.

In the present disclosure, a method of manufacturing a semiconductor structure is disclosed. A first substrate (such as a device substrate) and a second substrate (such as a carrier substrate) are provided. The first substrate or the second substrate is disposed with adhesives. In some embodiments, the first substrate is disposed with an adhesive including a polymeric material, a glue material or an adhesion promoter. The adhesive is then heated and pre-cured to partially cure the adhesive. After the pre-curing, the first substrate is permanently or temporarily bonded with the second substrate by the adhesive, and then undergoes thinning of the first substrate or the second substrate. The adhesive can enhance the bonding between the first substrate and the second substrate and prevent delamination of the first substrate from the second substrate during the thinning operations, while the first substrate can be separated from the second substrate after the thinning or other necessary operations. A quality of bonding is improved. Furthermore, less pressing force and shorter time are required for bonding the first substrate with the second substrate. Thus, the bonding is more efficient and a processing cost is lowered.

FIG. 1 is an embodiment of a method 100 of manufacturing a semiconductor structure. The method 100 includes a number of operations (101, 102, 103, 104. 105, 106, 107 and 108). The method 100 includes a number of operations and the description and illustration are not deemed as a limitation as the sequence of the operations. In some embodiments, a semiconductor structure is formed by a method 100.

Figure 1A:
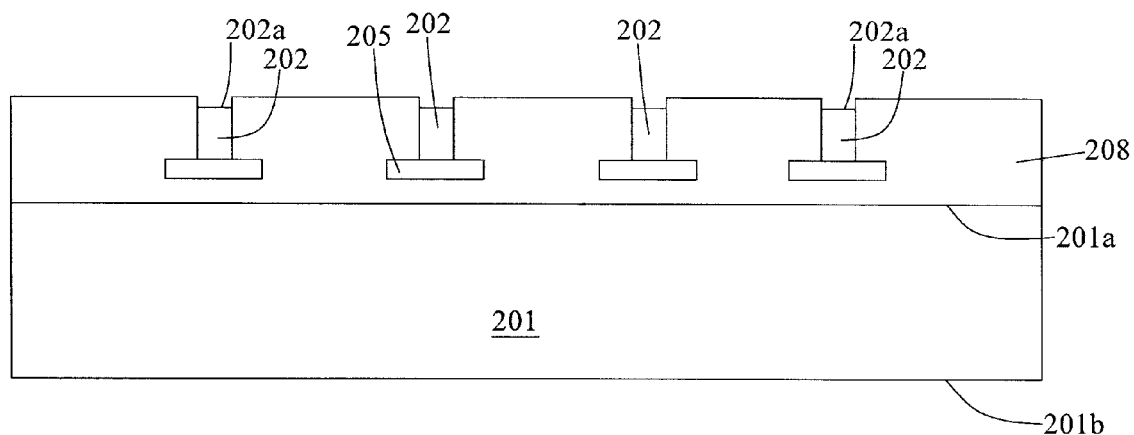
FIG. 1A is a schematic view of a first substrate in accordance with some embodiments of the present disclosure.

In operation 101, a first substrate 201 is received or provided as illustrated in FIG. 1A. In some embodiments, the first substrate 201 includes semiconductive materials such as silicon, germanium, gallium, arsenic or combinations thereof. In some embodiments, the first substrate 201 includes a first surface 201a and a second surface 201b opposite to the first surface 201a. In some embodiments, the first substrate 201 is a device substrate or a device wafer which includes several active devices or circuitries thereon. In some embodiments, the first substrate 201 is in a circular, quadrilateral or any other suitable shapes. In some embodiments, the first substrate 201 has a diameter of about 4 inches, 8 inches, 12 inches or any other suitable sizes.

In some embodiments, several active devices or circuitries are disposed over the first surface 201a of the first substrate 201. In some embodiments, several active devices such as n-type metal-oxide semiconductor (NMOS), p-type metal-oxide semiconductor (PMOS) devices, transistors, capacitors, resistors, diodes, photo-diodes or the like are disposed under, on, or over the first surface 201a of the first substrate 201. In some embodiments, some circuits for electrical connection of the active devices and other electrical components are disposed over the first surface 201a of the first substrate 201. In some embodiments, the electrical circuits formed on the first substrate 201 may be any type of circuitry suitable for a particular application. The electrical circuits may be interconnected to perform one or more functions.

In some embodiments, an intermetallic dielectric (IMD) layer 208 is disposed over the first substrate 201. In some embodiments, the IMD layer 208 includes several metallic structures 205 formed in and surrounded by dielectric materials. In some embodiments, the metallic structures 205 are electrically isolated from each other by the dielectric materials. In some embodiments, the metallic structures 205 are bond pads configured to receive other structures. In some embodiments, the metallic structure 205 includes conductive materials such as copper, aluminum, etc.

In some embodiments, several conductive bumps 202 are disposed over the metallic structure 205. In some embodiments, top surfaces 202a of the conductive bumps 202 are exposed from the IMD layer 208. In some embodiments, the conductive bumps 202 are configured to electrically connect with other circuits or other conductive structures. In some embodiments, the conductive bumps 202 are coupled with metallic structures 205, so that the conductive bumps 202 are configured to bond with external circuitries and electrically connect the metallic structures 205 with external circuitries. In some embodiments, the metallic structure 205 is a bond pad for receiving the conductive bump 202.

In some embodiments, each conductive bump 202 has a height of less than about 1 um. In some embodiments, the height of the conductive bump 202 is about 0.5 um to about 5 um. In some embodiments, each conductive bump 202 has a width of a cross-sectional surface is about 2 um. In some embodiments, the width of the conductive bump 202 is about 1 um to about 5 um. In some embodiments, the conductive bumps 202 are formed by any suitable operations such as electroless plating, electroplating, etc. In some embodiments, the conductive bump 202 includes conductive materials such as copper, gold, nickel, solder, etc. In some embodiments, the conductive bump 202 can be in any suitable shapes such as hemispherical, conical, cylindrical, etc.

Figure 1B:
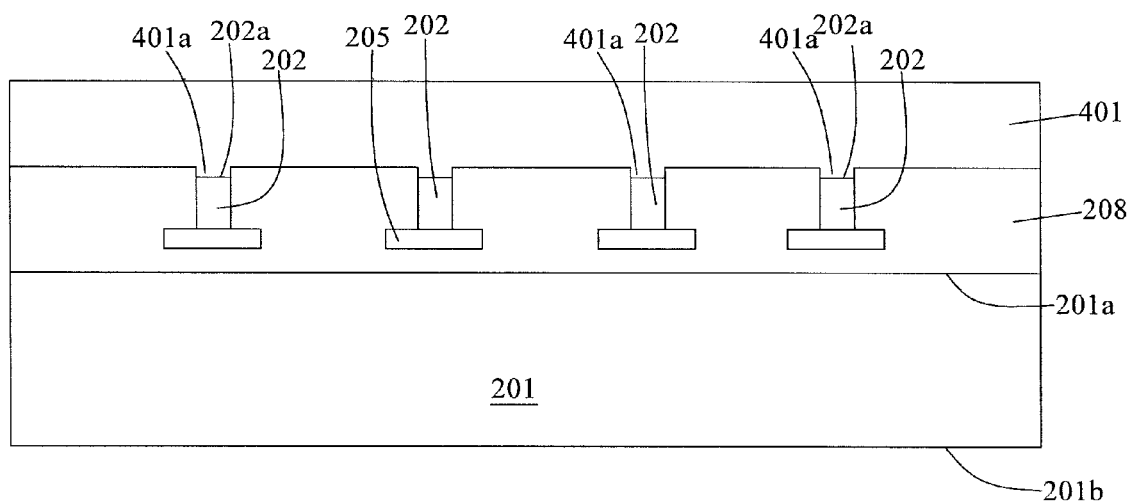
FIG. 1B is a schematic view of an adhesive disposed over a first substrate in accordance with some embodiments of the present disclosure.

In operation 102, an adhesive 401 is disposed over the first substrate 201 as shown in FIG. 1B. In some embodiments, the adhesive 401 is disposed over the IMD layer 208 and the conductive bumps 202. In some embodiments, the adhesive 401 is uniformly disposed across the first substrate 201. In some embodiments, the adhesive 401 has a thickness of about 1 um to about 100 um. In some embodiments, the adhesive 401 includes several protrusions 401a protruding towards the conductive bumps 202. In some embodiments, the adhesive 401 includes several recessions recessed away from the metallic structure 205 when the conductive bumps 202 are protruded from the IMD layer 208. In some embodiments, the protrusions 401a are contacted with top surfaces 202a of the conductive bumps 202. In some embodiments, the adhesive 401 includes polymeric material such as polymer, polyimide (PI), benzocyclobutene (BCB), etc. In some embodiments, a glue material or an adhesion promoter is disposed between the IMD 208 and the adhesive 401. In some embodiments, the adhesive 401 is disposed by any suitable operations such as spin coating, etc.

Figure 1C:
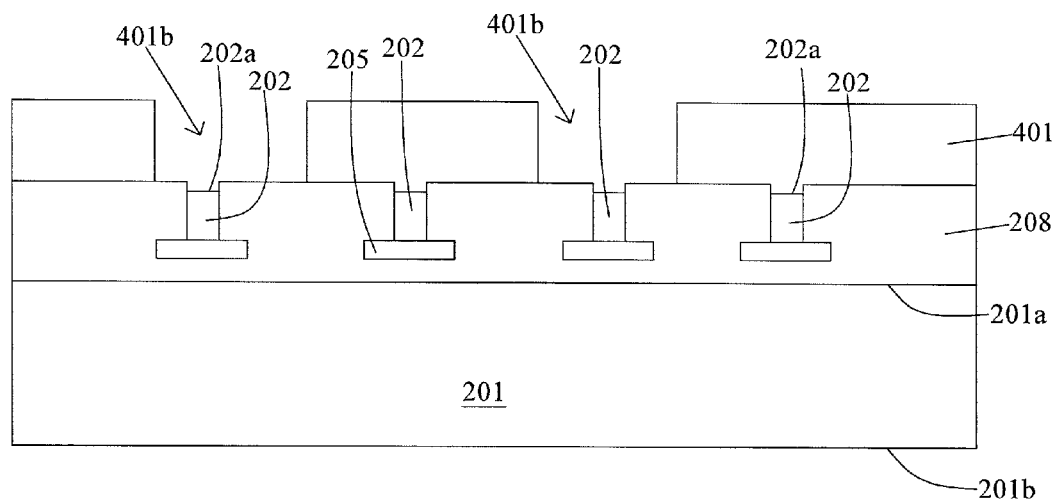
FIG. 1C is a schematic view of a patterned adhesive in accordance with some embodiments of the present disclosure.

In operation 103, the adhesive 401 is patterned as shown in FIG. 1C. In some embodiments, the adhesive 401 is patterned by removing some portions of the adhesive 401, such that some portions of the IMD layer 208 or some of top surfaces 202a of conductive bumps 202 are exposed from the adhesive 401. In some embodiments, the adhesive 401 is patterned by any suitable operations such as photolithography and etching. In some embodiments, a patterned photomask is disposed over the adhesive 401 and the adhesive 401 is exposed to an electromagnetic radiation. Those portions of the adhesive 401 without coverage of the photomask or portions of the adhesive 401 exposed to the electromagnetic radiation are removable by an etchant Thus, several openings 401b are formed and the adhesive 401 with the pattern is formed. In some embodiments, the opening 401b is in rectangular, quadrilateral, polygonal, triangular or any other shape. In some embodiments, the patterned adhesive 401 is heated in a first ambiance. In some embodiments, the adhesive 401 is pre-cured or partially cured in the first ambiance at a temperature of about 100° C. to about 400° C. In some embodiments, the first ambiance is at a temperature of about 100° C. to about 300° C.

Figure 1D:
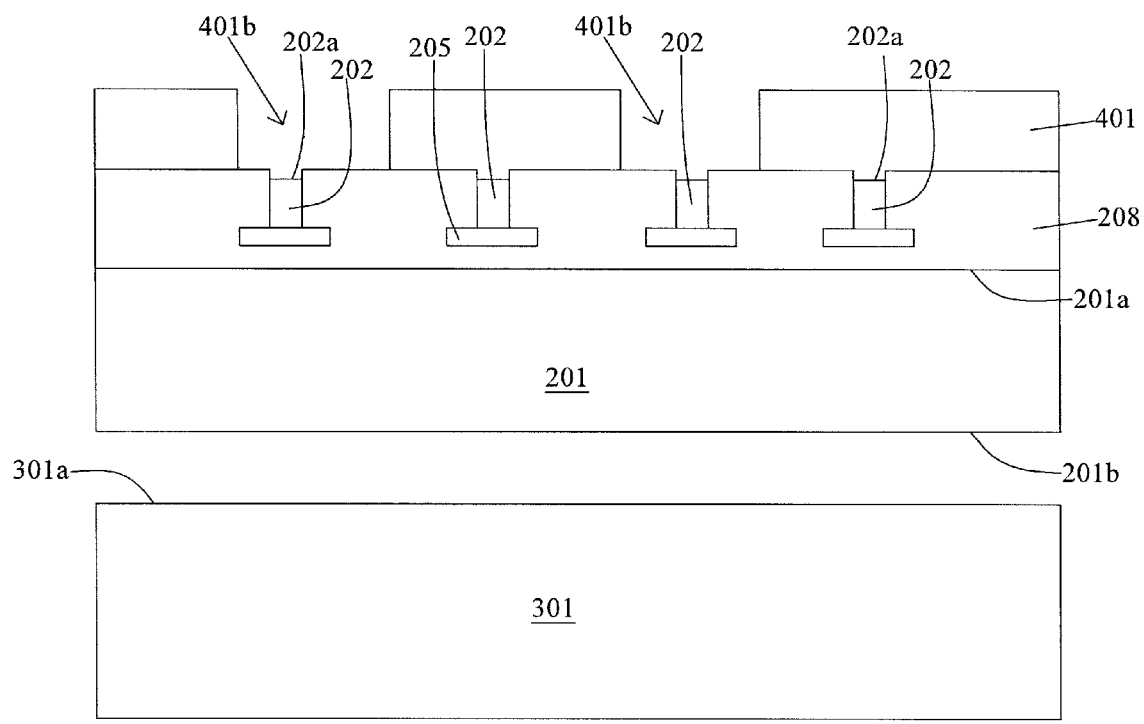
FIG. 1D is a schematic view of a first substrate and a second substrate in accordance with some embodiments of the present disclosure.

In operation 104, a second substrate 301 is received or provided as shown in FIG. 1D. In some embodiments, the second substrate 301 is a carrier substrate or handle wafer. In some embodiments, the second substrate 301 is configured for supporting another substrate or wafer with a very thin thickness. The second substrate 301 can provide a mechanical support to another substrate or wafer which would be subsequently processed by various operations. In some embodiments, the second substrate 301 includes a top surface 301a for facilitating a receipt of another substrate or wafer.

In some embodiments, the second substrate 301 includes silicon, glass, ceramic, etc. In some embodiments, the second substrate 301 is in a circular, quadrilateral, polygonal or any other suitable shapes. In some embodiments, the second substrate 301 has dimension and shape substantially same as the first substrate 201. In some embodiments, the second substrate 301 has a diameter substantially same as a diameter of the first substrate 201. In some embodiments, the diameter of the second substrate 301 is greater than the diameter of the first substrate 201. In some embodiments, the second substrate 301 has a thickness substantially greater than a thickness of the first substrate 201.

Figure 1E:
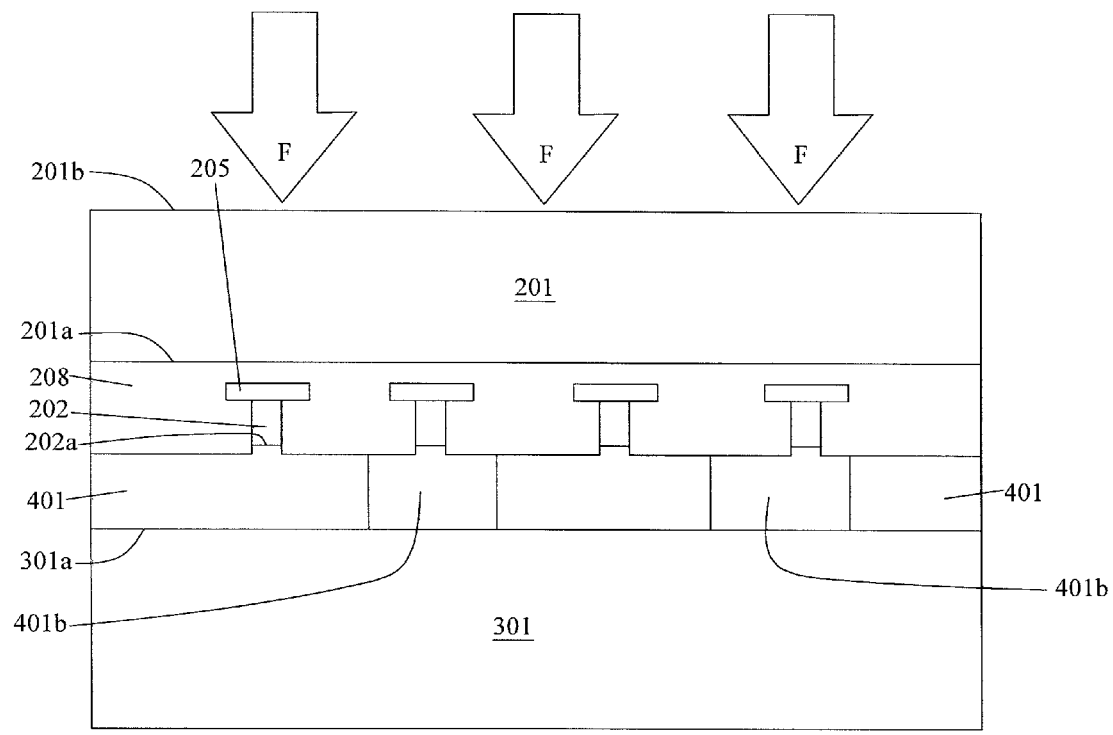
FIG. 1E is a schematic view of a first substrate bonded with a second substrate in accordance with some embodiments of the present disclosure.

In operation 105, the first substrate 201 is bonded with the second substrate 301 as shown in FIG. 1E. In some embodiments, the first substrate 201 is assembled and integrated with the second substrate 301. In some embodiments, the first substrate 201 is temporarily bonded with the second substrate 301. In some embodiments, the first substrate 201 is bonded with the second substrate 301 by applying a force F upon the first substrate 201 or the second substrate 301. The force F presses the first substrate 201 towards the second substrate 301 or presses the second substrate 301 towards the first substrate 201. In some embodiments, the force F is applied on the second surface 201$b$ of the first substrate 201 towards the second substrate 301 or applied on a bottom surface 301$b$ of the second substrate 301 towards the first substrate 201, such that the first substrate 201 is bonded with the second substrate 301 by the adhesive 401. In some embodiments, some of the IMD layer 208 and some of the top surface 301$a$ of the second substrate 301 are attached by the adhesive 401 because of the present of the openings 401$b$.

In some embodiments, the force F of less than about 10,000N (10 KN) is applied on the second surface 201$b$ of the first substrate 201 towards the second substrate 301 or applied on the bottom surface 301$b$ of the second substrate 301 towards the first substrate 201. Both the first substrate 201 and the second substrate 301 are wafers with a diameter of about 4 inches, 8 inches 12 inches or any other suitable sizes. In some embodiments, a duration of the application of the force F is less than about 10 minutes. In some embodiments, the duration is less than about 1 hour. In some embodiments, the duration of the application of the force F is about 5 minutes to about 30 minutes.

In some embodiments, the adhesive 401 is heated in a second ambiance upon the bonding of the first substrate 201 and the second substrate 301. In some embodiments, the adhesive 401 is heated in the second ambiance of a temperature about 120° C. to about 250° C. During the bonding of the first substrate 201 with the second substrate 301, the force F of less than about 10,000N is required to apply on the first substrate 201 or the second substrate 301, as the adhesive 401 is heated and pre-cured before the bonding, and is heated and post-cured after the bonding. In some embodiments, the first substrate 201 or the second substrate 301 has a diameter of about 4 inches, 8 inches, 12 inches or any other suitable sizes, and the force F of less than about 10,000N is required to apply on the first substrate 201 or the second substrate 301 upon the bonding of the first substrate 201 with the second substrate 301. The first substrate 201 or the second substrate 301 is in a large size (such as about 12 inches) while the force F of less than about 10,000N is required for bonding, because the adhesive 401 undergoes heating before and after the bonding.

In some embodiments, the adhesive 401 is heated in a third ambiance after the bonding the first substrate 201 with the second substrate 301. In some embodiments, the adhesive 401 is heated and post-cured in the third ambiance of a temperature about 250° C. to about 400° C. In some embodiments, the adhesion promoter is disposed between the second substrate 301 and the adhesive 401, so that the adhesive 401 is heated and post-cured in the third ambiance after the bonding the first substrate 201 with the second substrate 301. If the glue material is disposed between the second substrate 301 and the adhesive 401, the heating of the adhesive 401 in the third ambiance after the bonding may be not required.

Figure 1F:
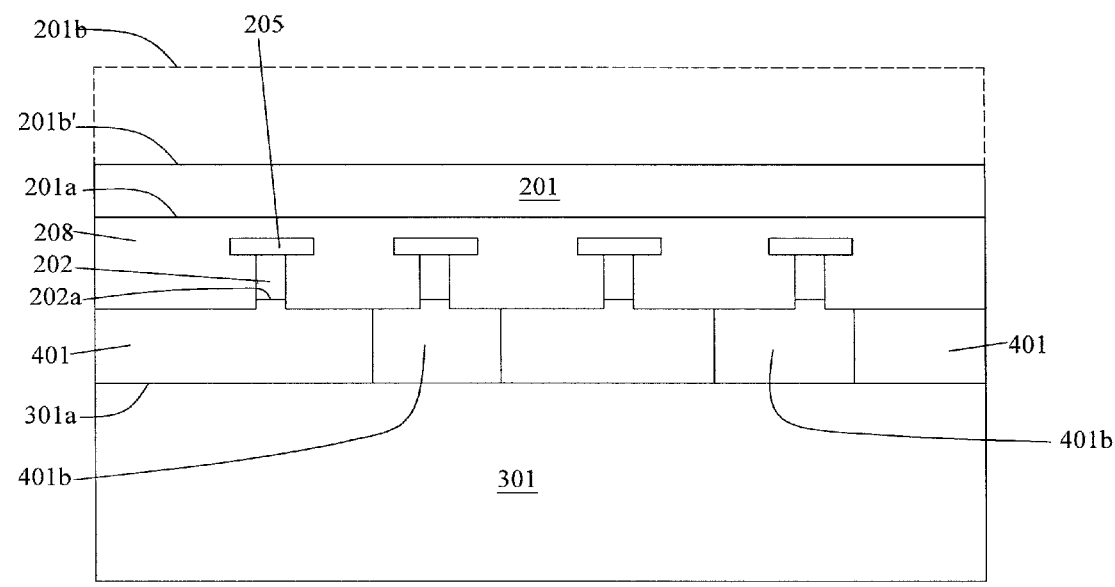
FIG. 1F is a schematic view of a thinned first substrate in accordance with some embodiments of the present disclosure.

In operation 106, the first substrate 201 is thinned down as shown in FIG. 1F. In some embodiments, a thickness of the first substrate is thinned down from the second surface 201$b$. The second surface 201$b$ becomes a new second surface 201$b'$. In some embodiments, a portion of the first substrate 201 is removed from the second surface 201$b$ towards the first surface 201$a$. In some embodiments, some of the first substrate 201 is removed by any suitable operations such as grinding, etching, etc. In some embodiments, a torque or shear is applied over the second surface 201$b$ of the first substrate 201 in order to remove the portion of the first substrate 201. In some embodiments, the thickness of the first substrate 201 is reduced to less than about 25 um after the thinning operations. In some embodiments, the thickness of the first substrate 201 is reduced to about 20 um to about 100 um. In some embodiments, several conductive structures such as a redistribution layer (RDL), conductive pad are formed over the second surface 201$b'$ of the second substrate 301.

In some embodiments, the first substrate 201 integrated with the second substrate 301 undergoes the thinning operations. The first substrate 201 is temporarily bonded with the second substrate 301 by the adhesive 401 upon the thinning operations. In some embodiments, the first substrate 201 is thinned down by mechanical grinding operations. For example, a grinder is used to remove some or all of the first substrate 201. In some embodiments, a grinding torque or shear is applied over the second surface 201$b$ to remove some of the first substrate 201. In some embodiments, the grinding torque is substantially less than a bonding force between the IMD layer 208 and the second substrate 301. In some embodiments, the bonding force is provided by the adhesive 401. In some embodiments, the bonding force is able to resist the grinding torque, so that the first substrate 201 would not be detached from the second substrate 301 upon the thinning operations.

Figure 1G:
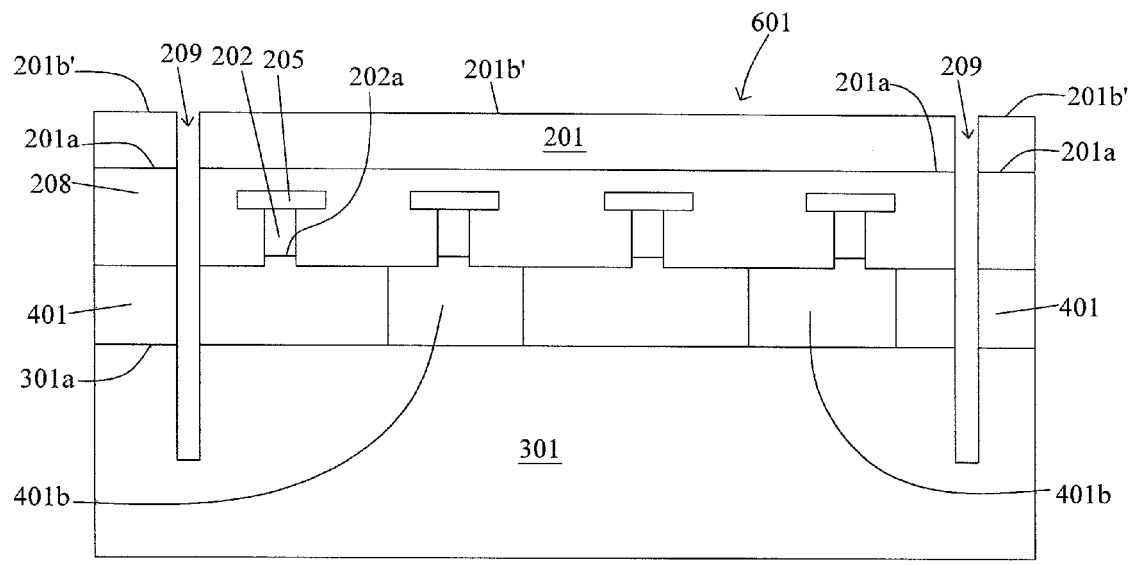
FIG. 1G is a schematic view of a chip singulated from a first substrate in accordance with some embodiments of the present disclosure.

In operation 107, a chip 601 is singulated as shown in FIG. 1G. In some embodiments, the chip 601 is singulated by sawn along a scribe line region 209. The first substrate 201, the IMD layer 208, the adhesive 401 and a part of the second substrate 301 are sawn at the scribe line region 209 by any suitable operations such as mechanical or laser sawing, etc. In some embodiments, the sawing is performed by any suitable means such as mechanical or laser blade.

Figure 1H:
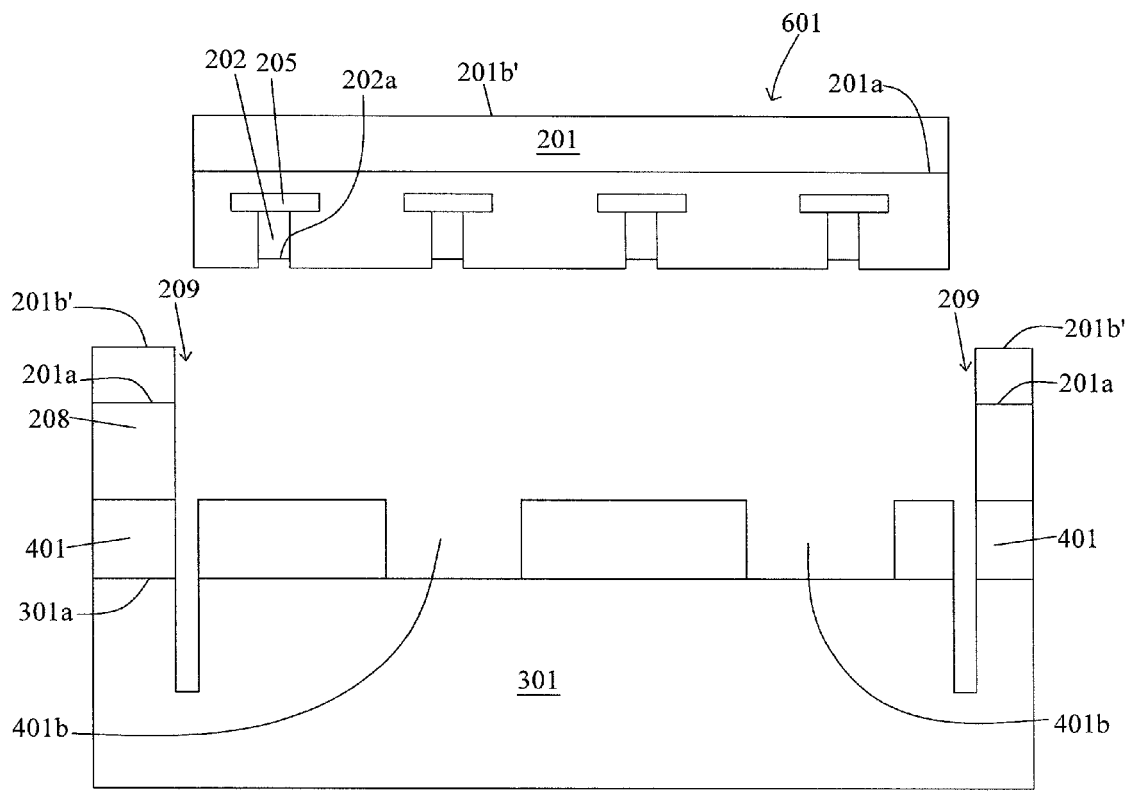
FIG. 1H is a schematic view of a chip separated from a second substrate in accordance with some embodiments of the present disclosure.

In operation 108, the chip 601 is separated from the second substrate 301 as shown in FIG. 1H. In some embodiments, the chip 601 is sucked up from the second substrate by an electrostatic force, so that the chip 601 is detached from the second substrate 301. In some embodiments, a bonding force between the IMD layer 208 and the adhesive 401 is substantially smaller than a force (e.g. the electrostatic force) picking up the chip 601, and therefore the chip 601 or the first substrate 201 can be separated from the second substrate 301.

Figure 2:
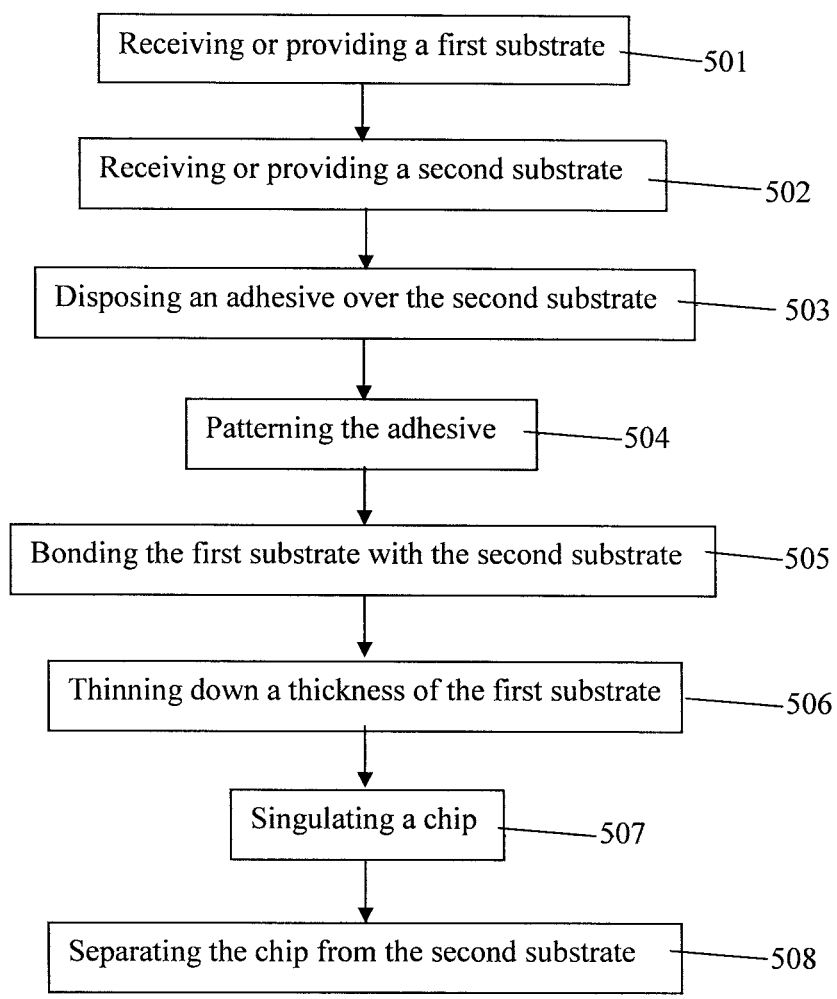
FIG. 2 is a flow diagram of a method of manufacturing a semiconductor structure in accordance with some embodiments of the present disclosure.

FIG. 2 is an embodiment of a method 500 of manufacturing a semiconductor structure. The method 500 includes a number of operations (501, 502, 503, 504, 505, 506, 507 and 508). The method 500 includes a number of operations and the description and illustration are not deemed as a limitation as the sequence of the operations. In some embodiments, a semiconductor structure is formed by a method 500.

Figure 2A:
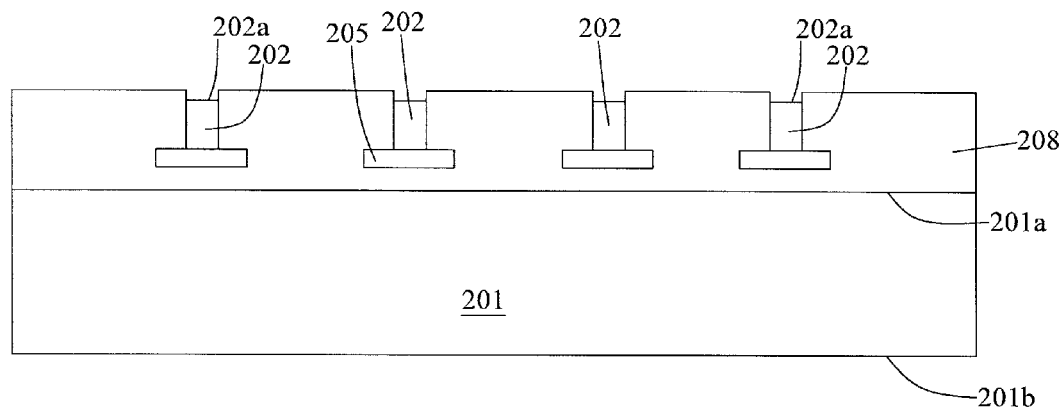
FIG. 2A is a schematic view of a first substrate in accordance with some embodiments of the present disclosure.
Figure 2B:
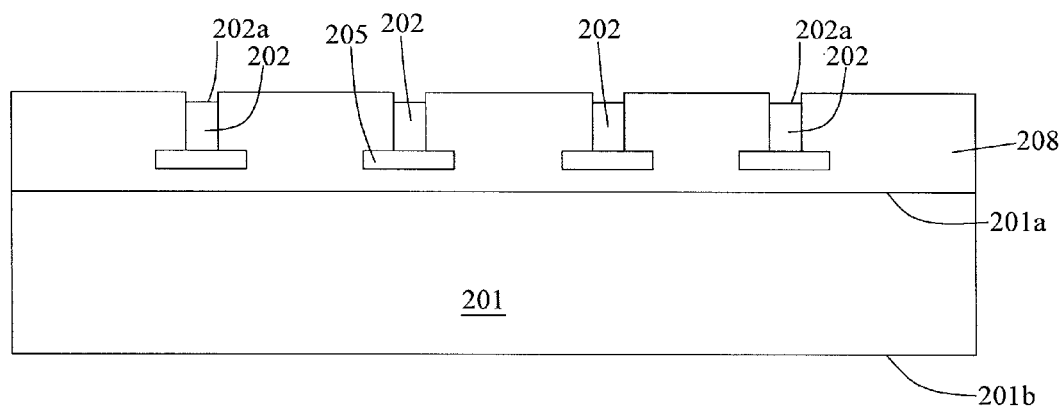
FIG. 2B is a schematic view of a first substrate and a second substrate in accordance with some embodiments of the present disclosure.
Figure 2B:
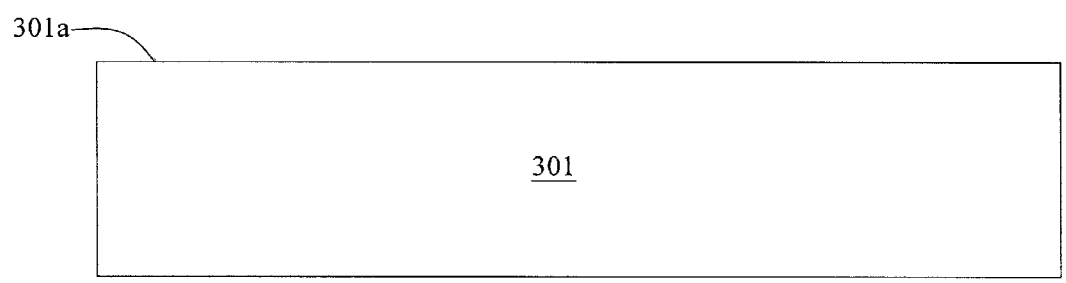
Figure 2C:
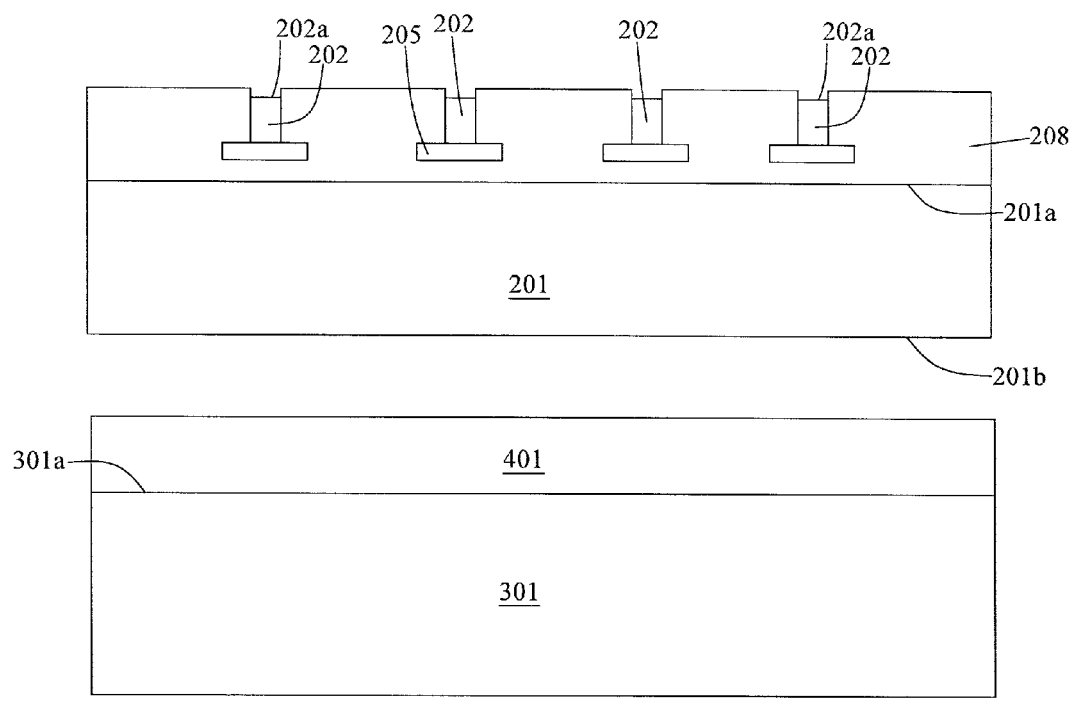
FIG. 2C is a schematic view of an adhesive disposed over a second substrate in accordance with some embodiments of the present disclosure.

In operation 501, a first substrate 201 is received or provided as shown in FIG. 2A. The operation 501 is similar to the operation 101. In operation 502, a second substrate 301 is received or provided as shown in FIG. 2B. The operation 502 is similar to the operation 104. In operation 503, an adhesive 401 is disposed over the second substrate 301 as shown in FIG. 2C. In some embodiments, the adhesive 401 is disposed over a top surface 301a of the second substrate 301. In some embodiments, the adhesive 401 includes polymeric material such as polymer, polyimide (PI), benzocyclobutene (BCB), etc. In some embodiments, a glue material or an adhesion promoter is disposed between the second substrate 301 and the adhesive 401. In some embodiments, the adhesive 401 is disposed by any suitable operations such as spin coating, etc.

Figure 2D:
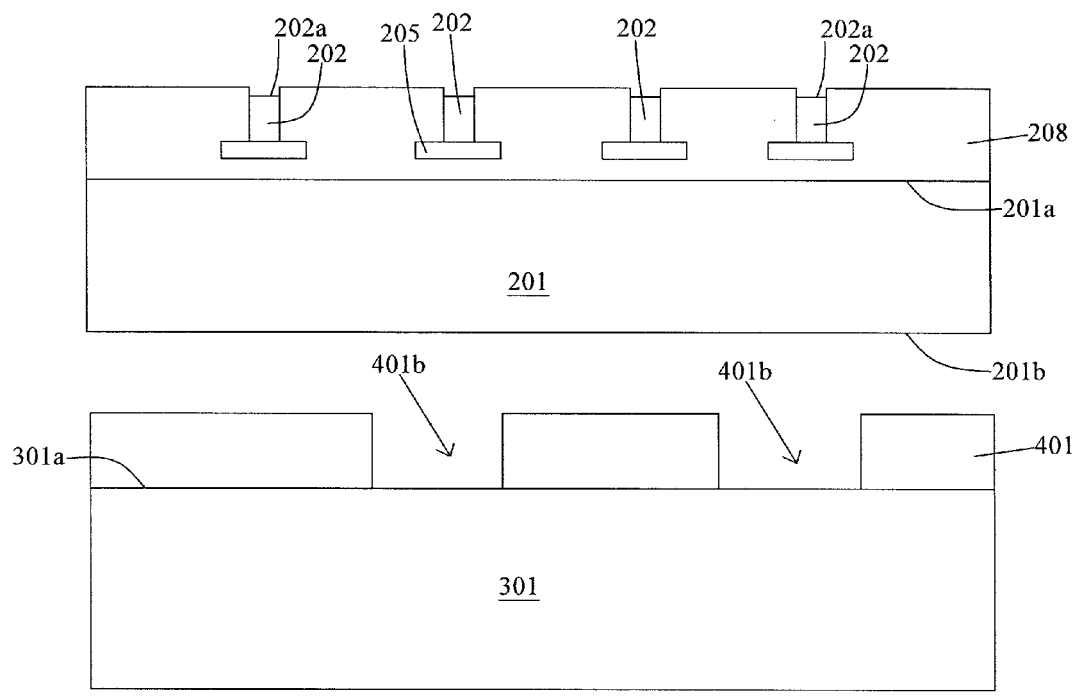
FIG. 2D is a schematic view of a patterned adhesive in accordance with some embodiments of the present disclosure.

In operation 504, the adhesive 401 is patterned as shown in FIG. 2D. In some embodiments, the adhesive 401 is patterned by removing some portions of the adhesive 401, such that some portions of the second substrate 301 are exposed from the adhesive 401. In some embodiments, the adhesive 401 is patterned by any suitable operations such as photolithography and etching. In some embodiments, a patterned photomask is disposed over the adhesive 401, and the adhesive 401 is exposed to an electromagnetic radiation. Those portions of the adhesive 401 without coverage of the photomask or portions of the adhesive 401 exposed to the electromagnetic radiation are removable by an etchant Thus, several openings 401b are formed and the adhesive 401 with the pattern is formed. In some embodiments, the patterned adhesive 401 is heated in a first ambiance. In some embodiments, the adhesive 401 is pre-cured and partially cured in the first ambiance at a temperature of about 100° C. to about 400° C. In some embodiments, the first ambiance is about 100° C. to about 300° C.

Figure 2E:
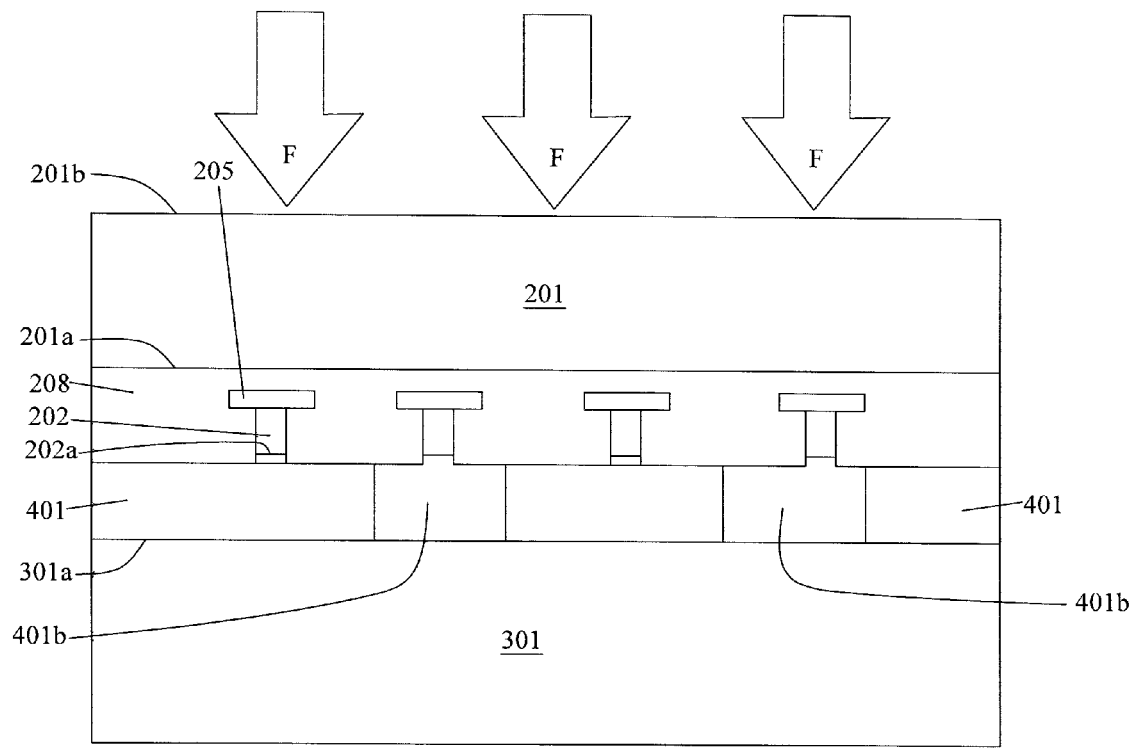
FIG. 2E is a schematic view of a first substrate bonded with a second substrate in accordance with some embodiments of the present disclosure.
Figure 2F:
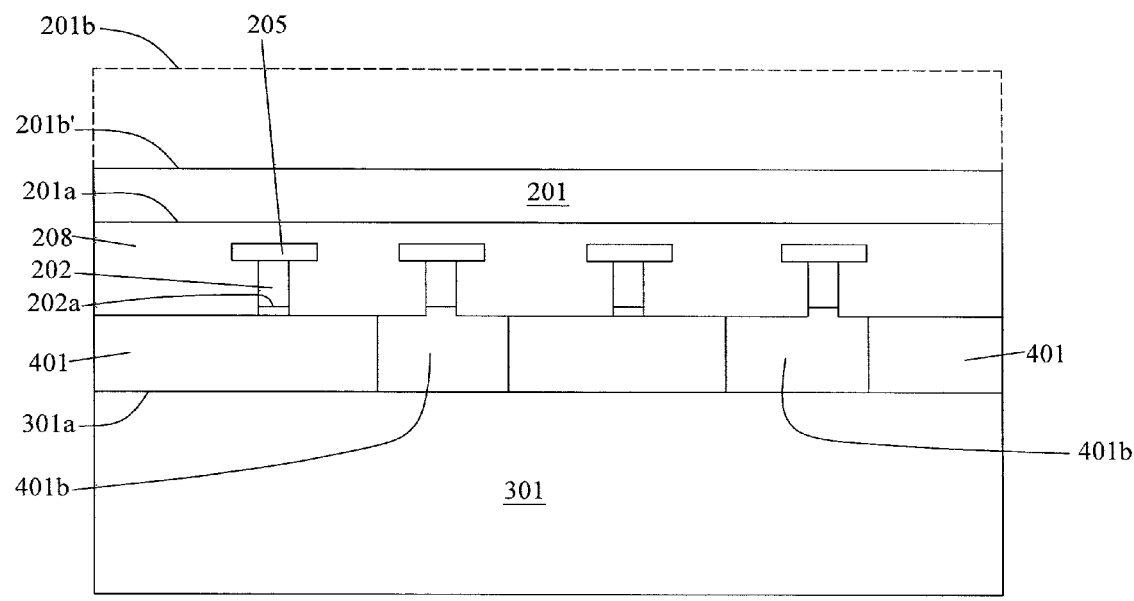
FIG. 2F is a schematic view of a thinned first substrate in accordance with some embodiments of the present disclosure.
Figure 2G:
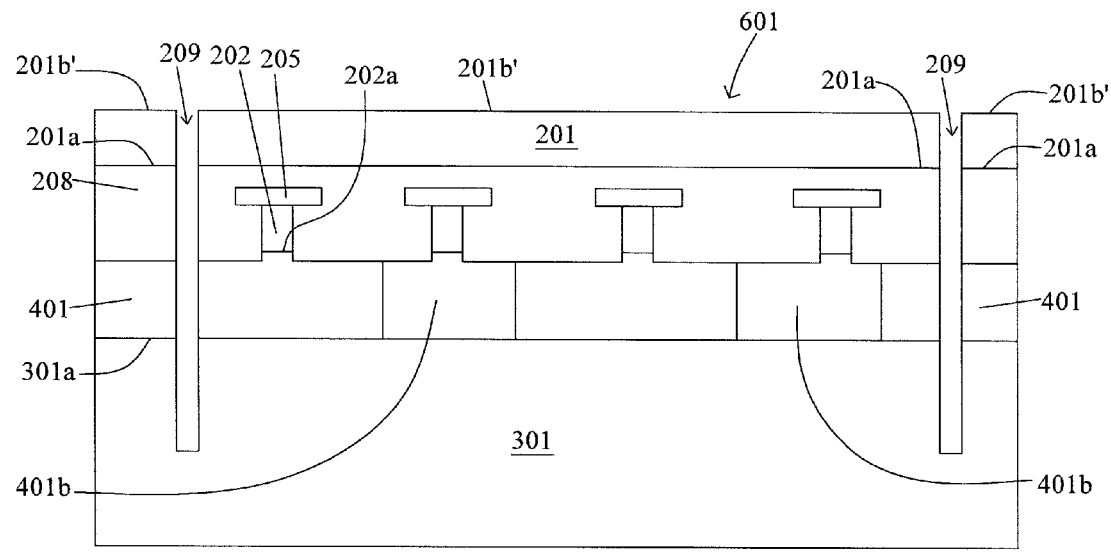
FIG. 2G is a schematic view of a chip singulated from a first substrate in accordance with some embodiments of the present disclosure.
Figure 2H:
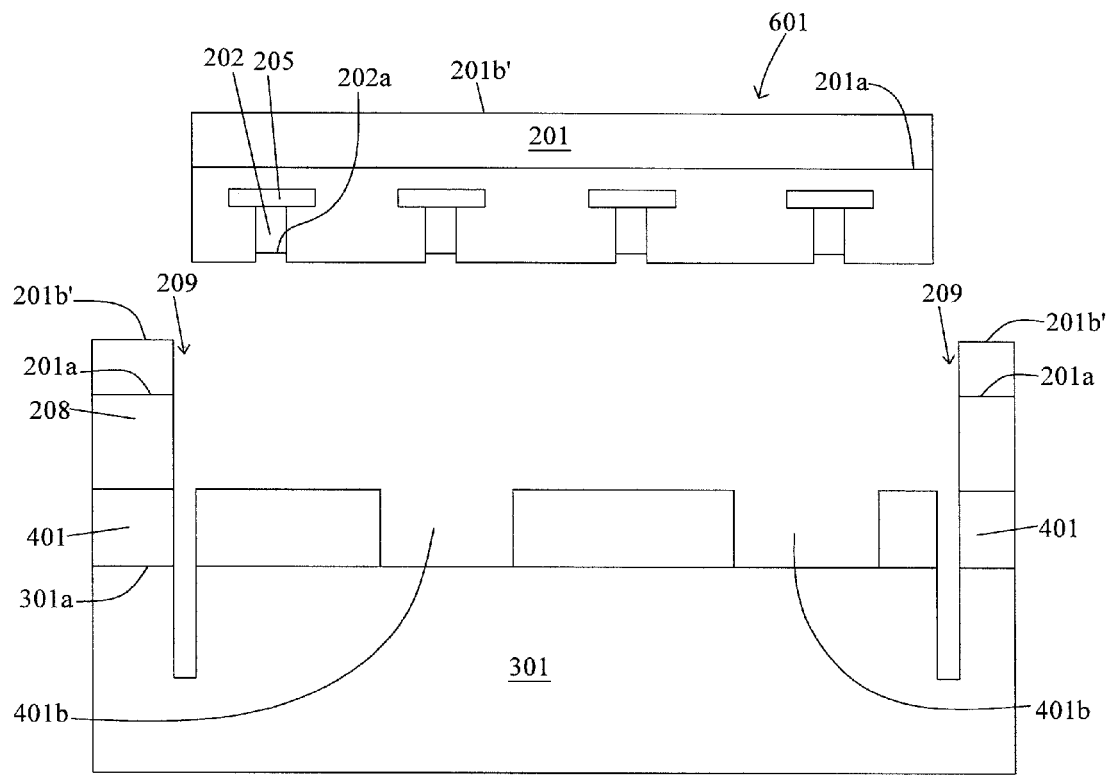
FIG. 2H is a schematic view of a chip separated from a second substrate in accordance with some embodiments of the present disclosure.

In operation 505, the first substrate 201 is bonded with the second substrate 301 as shown in FIG. 2E. The operation 505 is similar to the operation 105. In operation 506, the first substrate 201 is thinned down as shown in FIG. 2F. The operation 506 is similar to the operation 106. In operation 507, a chip 601 is singulated as shown in FIG. 2G. The operation 507 is similar to the operation 107. In operation 508, the chip 601 is separated from the second substrate 301 as shown in FIG. 2H. The operation 508 is similar to the operation 108.

Figure 3:
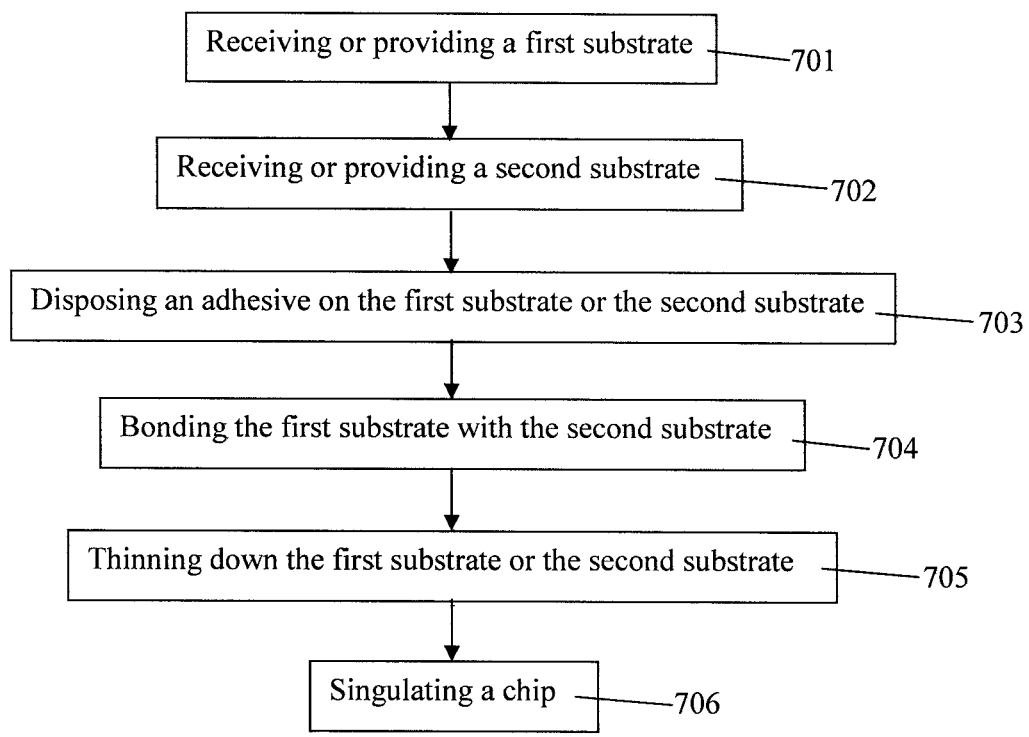
FIG. 3 is a flow diagram of a method of manufacturing a semiconductor structure in accordance with some embodiments of the present disclosure.

FIG. 3 is an embodiment of a method 700 of manufacturing a semiconductor structure. The method 700 includes a number of operations (701, 702, 703, 704, 705 and 706). The method 700 includes a number of operations and the description and illustration are not deemed as a limitation as the sequence of the operations. In some embodiments, a semiconductor structure is formed by a method 700.

Figure 3A:
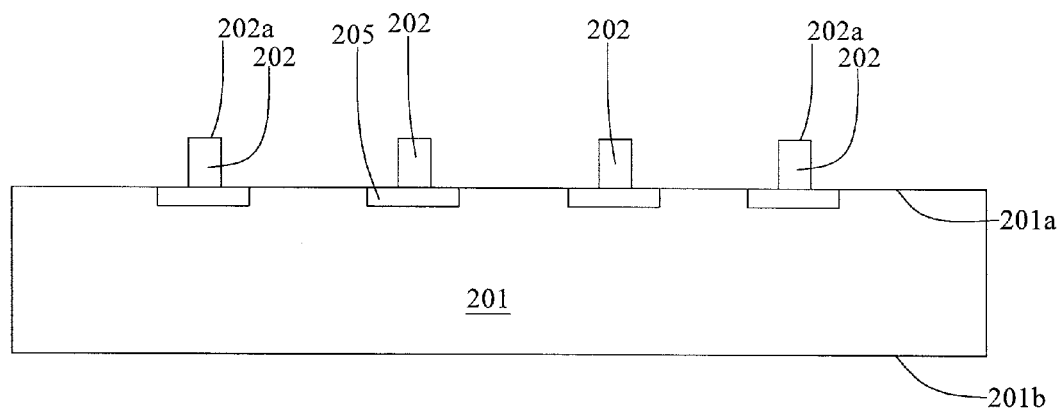
FIG. 3A is a schematic view of a first substrate in accordance with some embodiments of the present disclosure.

In operation 701, a first substrate 201 is received or provided as illustrated in FIG. 3A. In some embodiments, the first substrate 201 includes semiconductive materials such as silicon, germanium, gallium, arsenic or combinations thereof. In some embodiments, the first substrate 201 is a device substrate or a device wafer which includes several active devices or circuitries thereon. In some embodiments, the first substrate 201 is in a circular, quadrilateral or any other suitable shapes. In some embodiments, the first substrate 201 has a diameter of about 4 inches, 8 inches, 12 inches or any other suitable sizes.

In some embodiments, several active devices or circuitries are disposed over or under the first surface 201a of the first substrate 201. In some embodiments, several active devices such as n-type metal-oxide semiconductor (NMOS), p-type metal-oxide semiconductor (PMOS) devices, transistors, capacitors, resistors, diodes, photo-diodes or the like are disposed under, on, or over the first surface 201a of the first substrate 201. In some embodiments, some circuits for electrical connection of the active devices and other electrical components are disposed over the first surface 201a of the first substrate 201. In some embodiments, the electrical circuits formed on the first substrate 201 may be any type of circuitry suitable for a particular application. The electrical circuits may be interconnected to perform one or more functions.

In some embodiments, several metallic structures 205 are disposed over the first surface 201a of the first substrate 201. In some embodiments, the metallic structures 205 are bond pads configured to receive other conductive structures. In some embodiments, the metallic structure 205 includes conductive materials such as copper, aluminum, gold, etc.

In some embodiments, several conductive bumps 202 are disposed over the first surface 201a of the first substrate 201. In some embodiments, the conductive bumps 202 are disposed over the metallic structures 205. In some embodiments, the conductive bumps 202 are configured to electrically connect with other circuits or other conductive structures. In some embodiments, the conductive bumps 202 are coupled and electrically connected with metallic structures 205. In some embodiments, the conductive bumps 202 are configured to bond with external circuitries and electrically connect the metallic structures 205 with external circuitries.

In some embodiments, each conductive bump 202 has a height of less than about 1 um. In some embodiments, the height of the conductive bump 202 is about 0.5 um to about 5 um. In some embodiments, each conductive bump 202 has a width of a cross-sectional surface is about 2 um. In some embodiments, the width of the conductive bump 202 is about 1 um to about 5 um. In some embodiments, the conductive bumps 202 are formed by any suitable operations such as electroless plating, electroplating, etc. In some embodiments, the conductive bump 202 includes conductive materials such as copper, gold, nickel, solder, etc. In some embodiments, the conductive bump 202 can be in any suitable shapes such as hemispherical, conical, cylindrical, etc.

Figure 3B:
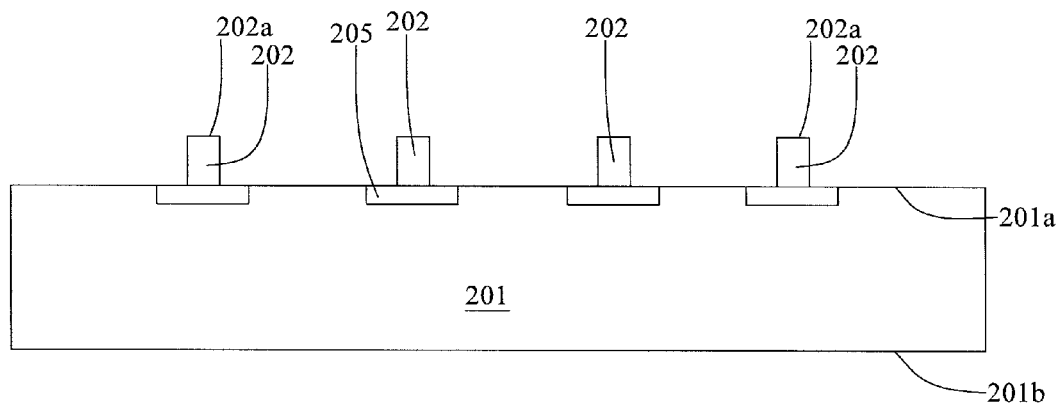
FIG. 3B is a schematic view of a first substrate and a second substrate in accordance with some embodiments of the present disclosure.
Figure 3B:
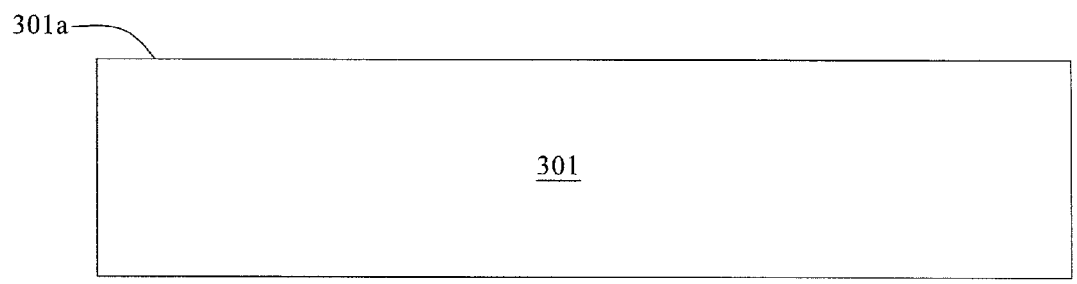

In operation 702, a second substrate 301 is received or provided as shown in FIG. 3B. In some embodiments, the second substrate 301 is a carrier substrate or handle wafer. In some embodiments, the second substrate 301 is configured for supporting another substrate or wafer in a small thickness. The second substrate 301 can provide a mechanical support to another substrate or wafer which would be subsequently processed by various operations. In some embodiments, the second substrate 301 includes a top surface 301a for facilitating a receipt of another substrate or wafer.

In some embodiments, the second substrate 301 includes silicon, glass, ceramic, etc. In some embodiments, the second substrate 301 is in a circular, quadrilateral, polygonal or any other suitable shapes. In some embodiments, the second substrate 301 has dimension and shape substantially same as the first substrate 201. In some embodiments, the second substrate 301 has a diameter substantially same as to diameter of the first substrate 201. In some embodiments, the diameter of the second substrate 301 is greater than the diameter of the first substrate 201. In some embodiments, the second substrate 301 has a thickness substantially greater than a thickness of the first substrate 201.

Figure 3C:
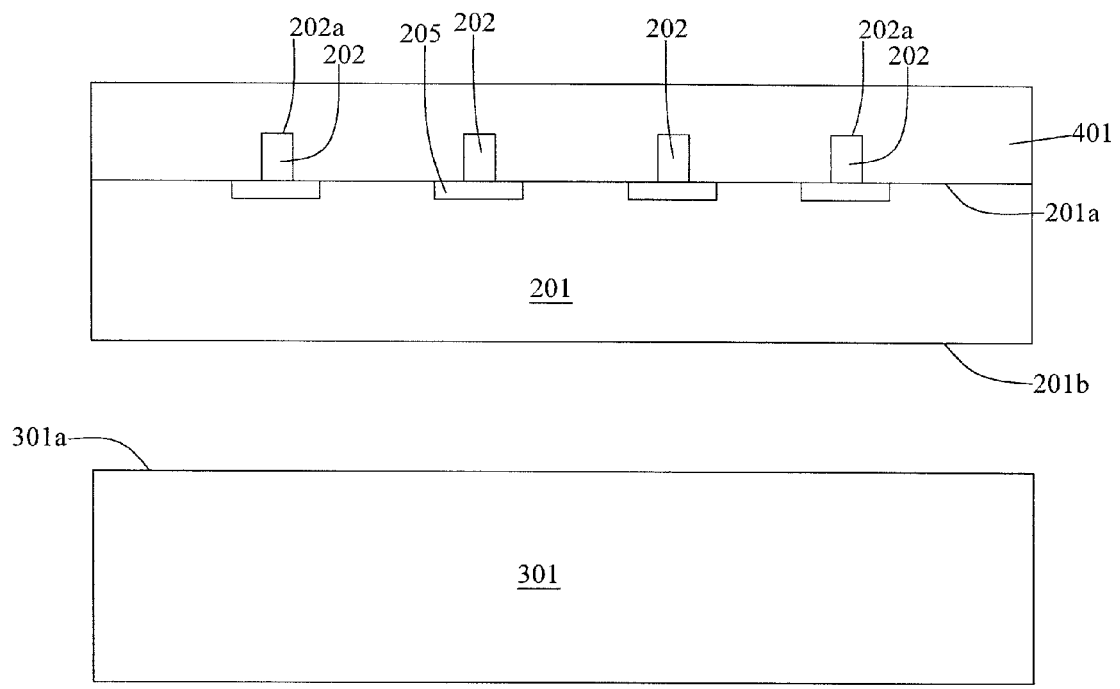
FIG. 3C is a schematic view of an adhesive disposed over a first substrate in accordance with some embodiments of the present disclosure.
Figure 3D:
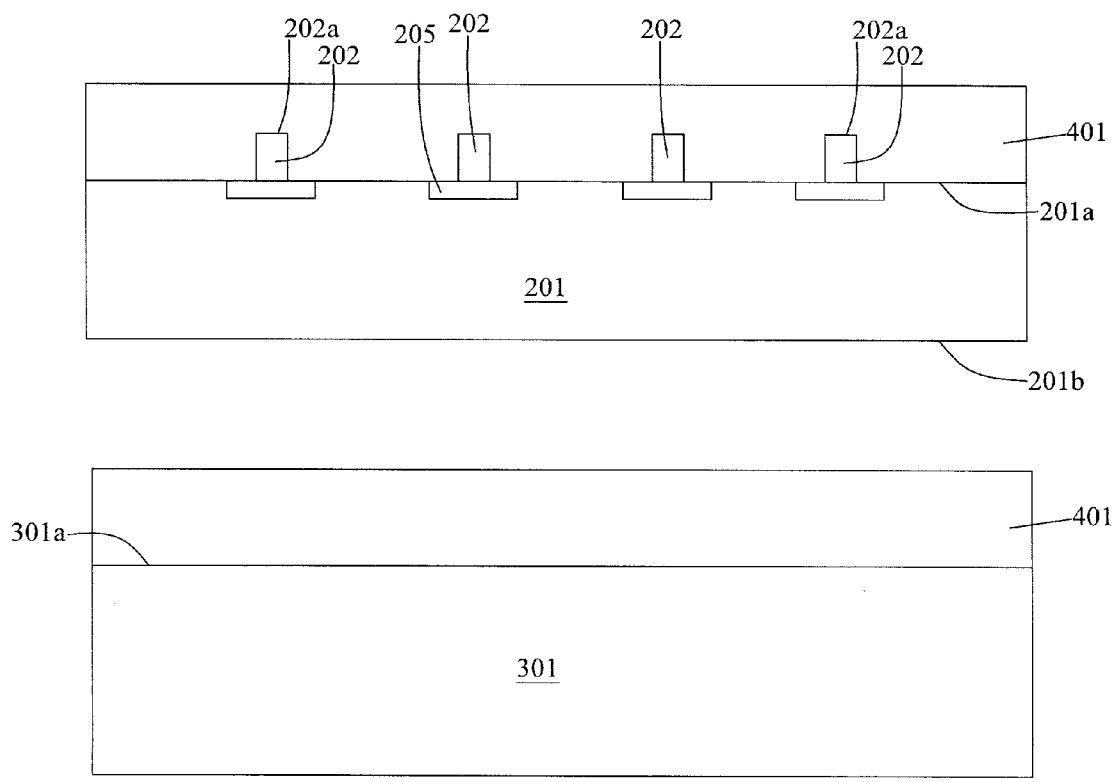
FIG. 3D is a schematic view of an adhesive disposed over a second substrate in accordance with some embodiments of the present disclosure.

In operation 703, an adhesive 401 is disposed over the first substrate 201 or the second substrate 301 as shown in FIGS. 3C and 3D. In some embodiments as shown in FIG.

3C, the adhesive 401 is disposed over the first surface 201*a* of the first substrate 201. In some embodiments, the adhesive 401 surrounds the conductive bumps 202. In some embodiments, the adhesive 401 is uniformly disposed across the first substrate 201. In some embodiments, the adhesive 401 has a thickness of about 1 um to about 100 um. In some embodiments, the adhesive 401 includes polymeric material such as polymer, polyimide (PI), benzocyclobutene (BCB), etc. In some embodiments, a glue material or an adhesion promoter is disposed between the adhesive 401 and the first substrate 201. In some embodiments, the adhesive 401 is disposed over the first substrate 201 by any suitable operations such as spin coating, etc.

In some embodiments as shown in FIG. 3D, the adhesive 401 is disposed over the second substrate 301. In some embodiments, the adhesive 401 is disposed over the top surface 301*a* of the second substrate 301. In some embodiments, the adhesive 401 is uniformly disposed across the second substrate 301. In some embodiments, the adhesive 401 has a thickness of about 1 um to about 100 um. In some embodiments, the adhesive 401 includes polymeric material such as polymer, polyimide (PI), benzocyclobutene (BCB), etc. In some embodiments, a glue material or an adhesion promoter is disposed between the adhesive 401 and the second substrate 301. In some embodiments, the adhesive 401 is disposed over the second substrate 301 by any suitable operations such as spin coating, etc.

In some embodiments, the adhesive 401 is heated in a first ambiance after disposing over the first substrate 201 or the second substrate 301. In some embodiments, the adhesive 401 disposed over the first substrate 201 or the second substrate 301 is heated in the first ambiance. In some embodiments, the adhesive 401 is pre-cured or partially-cured under the first ambiance. In some embodiments, the first ambiance is at a temperature of about 100° C. to about 300° C. In some embodiments, the first ambiance is at a temperature of about 100° C. to about 400° C.

Figure 3E:
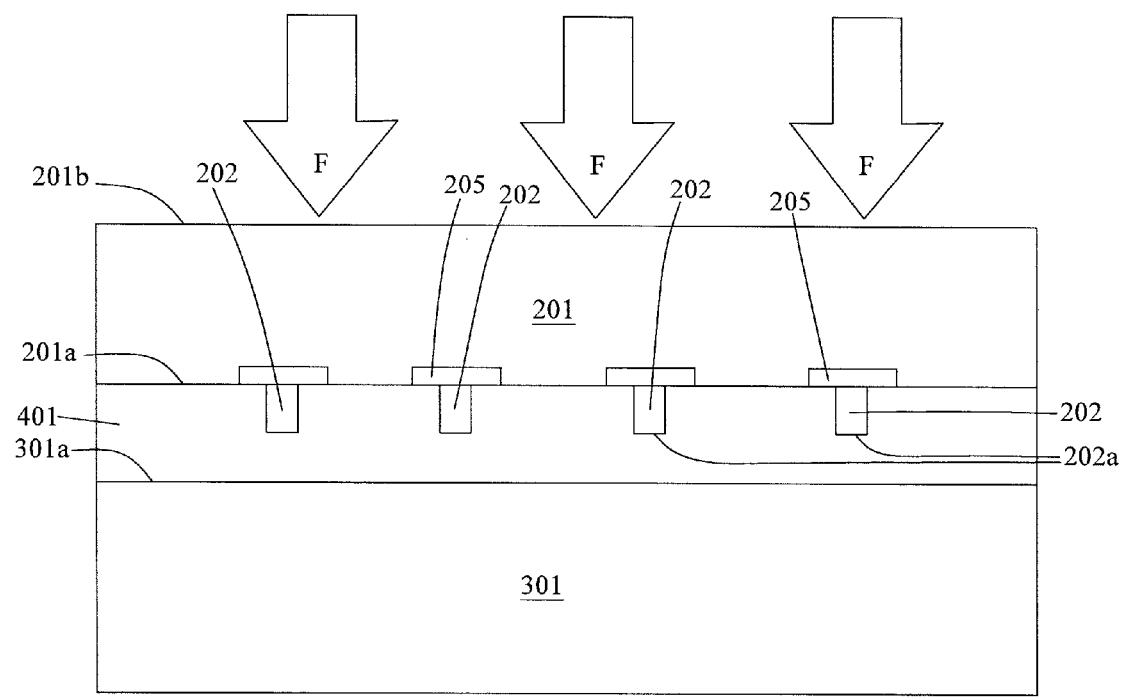
FIG. 3E is a schematic view of a first substrate bonded with a second substrate in accordance with some embodiments of the present disclosure.

In operation 704, the first substrate 201 is bonded with the second substrate 301 by the adhesive 401 as shown in FIG. 3E. In some embodiments, the first substrate 201 is flipped and bonded with the second substrate 301. In some embodiments, the first substrate 201 is assembled and integrated with the second substrate 301. In some embodiments, the first substrate 201 is permanently bonded with the second substrate 301.

In some embodiments, the first substrate 201 is bonded with the second substrate 301 by applying a force F upon the first substrate 201 or the second substrate 301. The force F presses the first substrate 201 towards the second substrate 301 or presses the second substrate 301 towards the first substrate 201. In some embodiments, the force F is applied on the second surface 201*b* of the first substrate 201 towards the second substrate 301 or applied on a bottom surface 301*b* of the second substrate 301 towards the first substrate 201, such that the first substrate 201 is bonded with the second substrate 301 by the adhesive 401.

In some embodiments, the force F of less than about 10,000N (10 KN) is applied on the second surface 201*b* of the first substrate 201 towards the second substrate 301 or applied on the bottom surface 301*b* of the second substrate 301 towards the first substrate 201. In some embodiments, both the first substrate 201 and the second substrate 301 are wafers respectively with a diameter of about 4 inches, 8 inches, 12 inches or any other suitable sizes.

In some embodiments, a duration of the application of the force F is less than about 10 minutes. In some embodiments, the duration of the application of the force F is about 5 minutes to about 30 minutes. In some embodiments, the duration is less than about 1 hour. In some embodiments, the adhesive 401 is heated in a second ambiance upon the bonding of the first substrate 201 and the second substrate 301. In some embodiments, the adhesive 401 is heated in the second ambiance of a temperature about 120° C. to about 250° C.

During the bonding of the first substrate 201 with the second substrate 301, the force F of less than about 10,000N is required to apply on the first substrate 201 or the second substrate 301, as the adhesive 401 is heated and pre-cured before the bonding, and is heated and post-cured after the bonding. In some embodiments, the first substrate 201 or the second substrate 301 has a diameter of about 12 inches, and the force F of less than about 10,000N is required to apply on the first substrate 201 or the second substrate 301 upon the bonding of the first substrate 201 with the second substrate 301. The first substrate 201 or the second substrate 301 is in a large size (about 12 inches) while the force F of less than about 10,000N is required for bonding, because the adhesive 401 undergoes heating before and after the bonding.

In some embodiments, the adhesive 401 is heated in a third ambiance to solidify the adhesive 401 after the bonding the first substrate 201 with the second substrate 301. In some embodiments, the adhesive 401 is heated and post-cured in the third ambiance of a temperature about 250° C. to about 400° C. In some embodiments, the adhesion promoter is disposed between the second substrate 301 and the adhesive 401 or between the first substrate 201 and the adhesive 401, and thus the adhesive 401 is post-cured in the third ambiance after the bonding the first substrate 201 with the second substrate 301. If the glue material is disposed between the second substrate and the adhesive 401 or between the first substrate 201 and the adhesive 401, the heating of the adhesive 401 after the bonding may be not required.

Figure 3F:
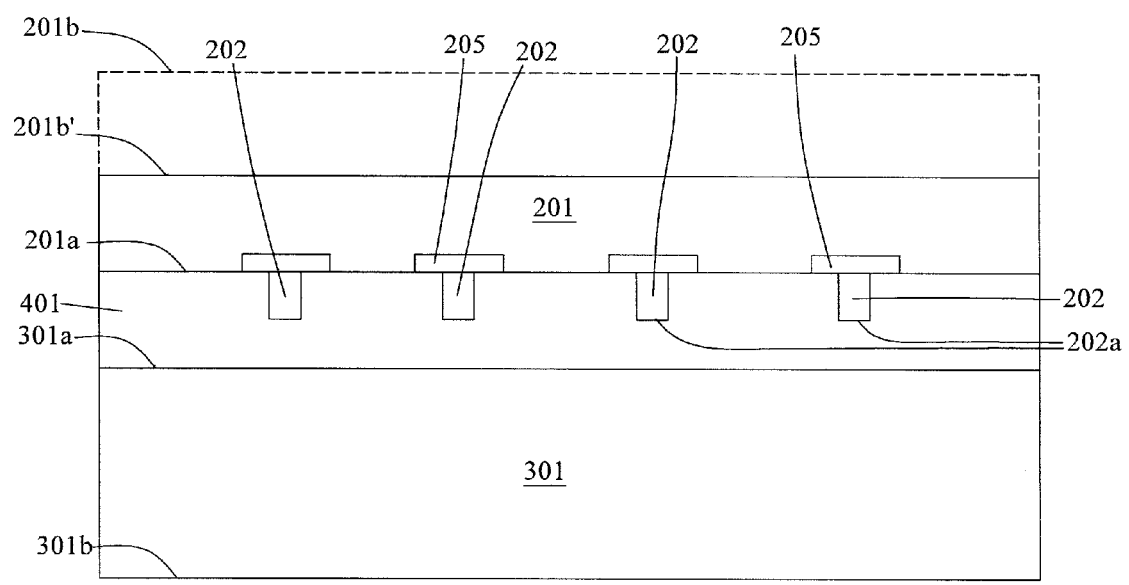
FIG. 3F is a schematic view of a thinned first substrate in accordance with some embodiments of the present disclosure.

In operation 705, the first substrate 201 or the second substrate 301 is thinned down as shown in FIG. 3F. In some embodiments, a thickness of the first substrate 201 is thinned down from the second surface 201*b* towards the first surface 201*a*, or a thickness of the second substrate 301 is thinned down from the bottom surface 301*b* towards the top surface 301*a* of the second substrate 301. In some embodiments, the second surface 201*b* becomes a new second surface 201*b'*. In some embodiments, a portion of the first substrate 201 is removed from the second surface 201*b*. In some embodiments, some of the first substrate 201 or some of the second substrate 301 are removed by any suitable operations such as grinding, etching, etc. In some embodiments, a torque or shear is applied over the second surface 201*b* of the first substrate 201 or the bottom surface 301*b* of the second substrate 301 in order to remove the portion of the first substrate 201 or the portion of the second substrate 301. In some embodiments, the thickness of the first substrate 201 is reduced to less than about 25 um after the thinning operations. In some embodiments, the thickness of the first substrate 201 is reduced to about 20 um to about 100 um after the thinning operations.

Figure 3G:
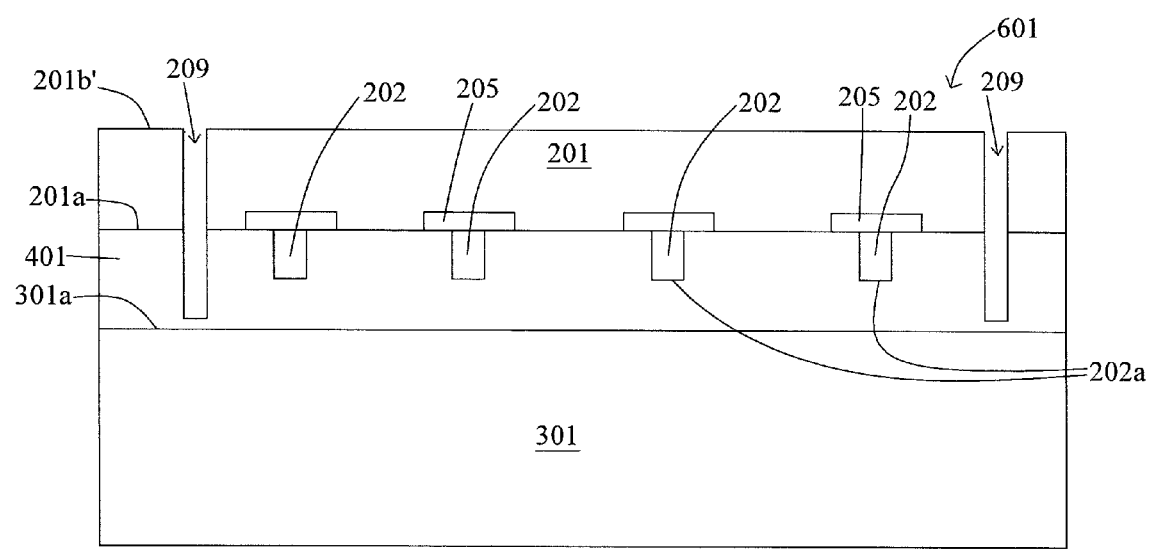
FIG. 3G is a schematic view of a chip singulated from a first substrate in accordance with some embodiments of the present disclosure.

In operation 706, a chip 601 is singulated as shown in FIG. 3G. In some embodiments, the first substrate 201 is sawn along a scribe line region 209 to singulate a chip 601. In some embodiments, the first substrate 201 is partially sawn from the second surface 201*b'* through the first substrate and a part of the adhesive 401, before reaching the top surface 301*a* of the second substrate 301. In some embodiments, the first substrate 201 is sawn through the first substrate 201, the adhesive 401 and a part of the second substrate 301. In some embodiments, the first substrate 201 is sawn by any suitable operations such as mechanical sawing, laser sawing, etc. In some embodiments, the sawing of the first substrate 201 is performed by mechanical or laser blade.

Figure 4:
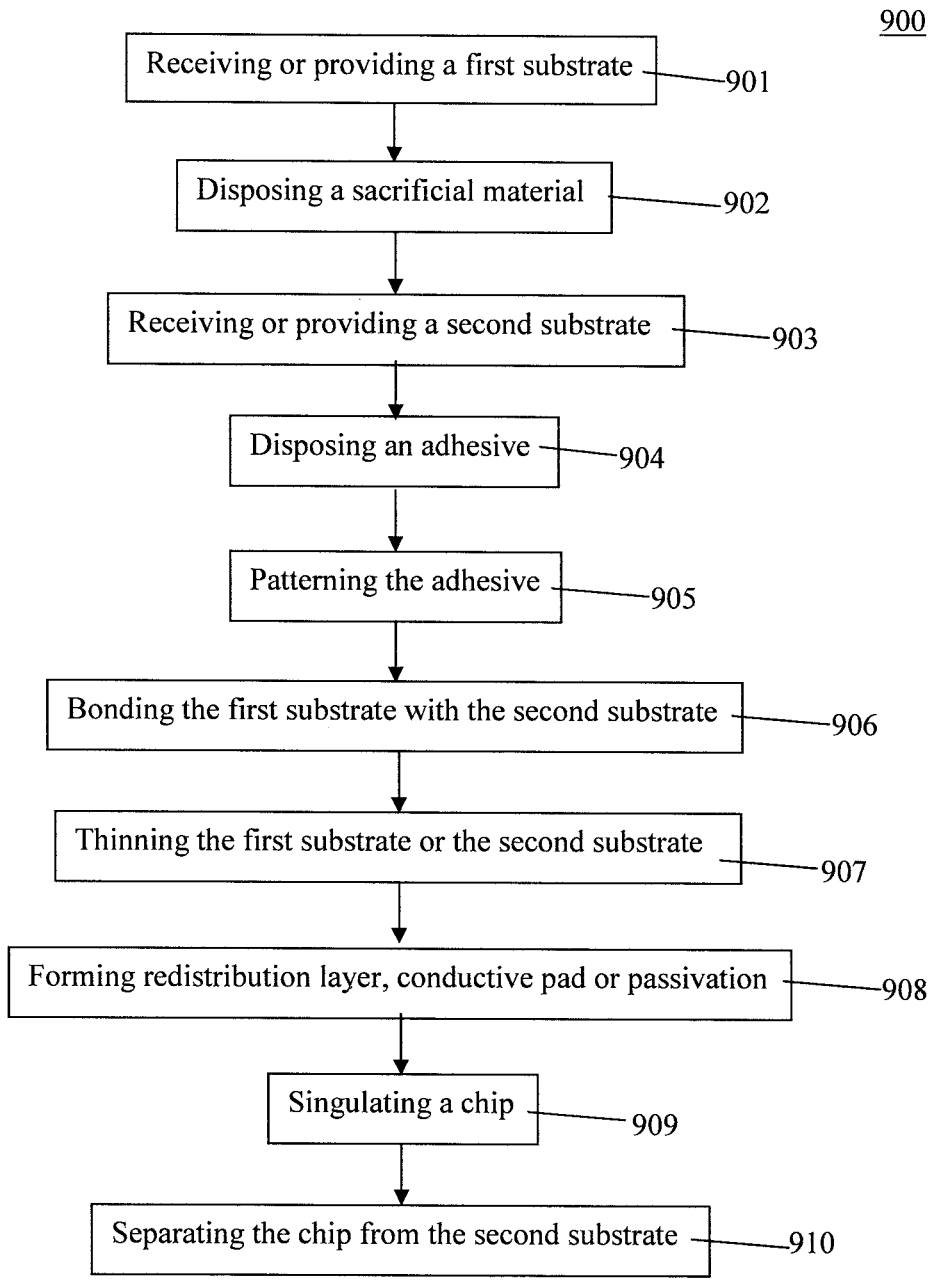
FIG. 4 is a flow diagram of a method of manufacturing a semiconductor structure in accordance with some embodiments of the present disclosure.

FIG. 4 is an embodiment of a method 900 of manufacturing a semiconductor structure. The method 900 includes a number of operations (901, 902, 903, 904, 905, 906, 907, 908, 909 and 910). The method 900 includes a number of operations and the description and illustration are not deemed as a limitation as the sequence of the operations. In some embodiments, a semiconductor structure is formed by a method 900.

Figure 4A:
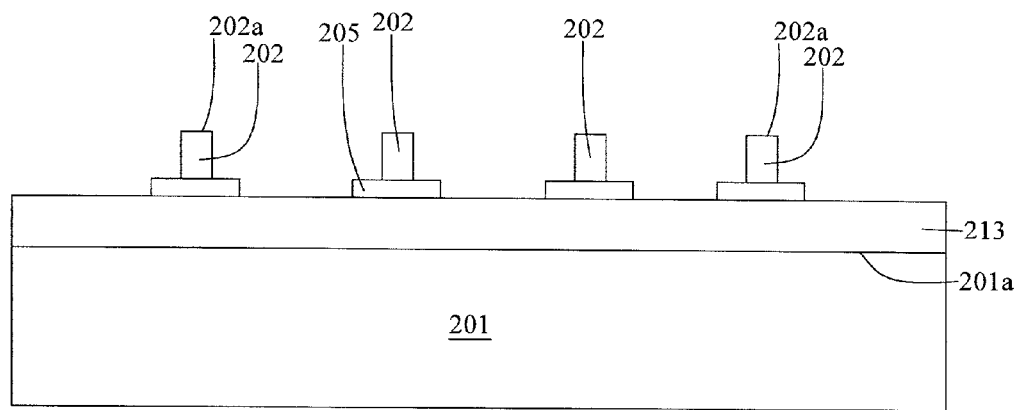
FIG. 4A is a schematic view of a first substrate in accordance with some embodiments of the present disclosure.

In operation 901, a first substrate 201 is received or provided as illustrated in FIG. 4A. In some embodiments, the first substrate 201 includes semiconductive materials such as silicon, germanium, gallium, arsenic or combinations thereof. In some embodiments, the first substrate 201 includes a first surface 201a and a second surface 201b opposite to the first surface 201a. In some embodiments, the first substrate 201 is a device substrate or a device wafer which includes several active devices or circuitries thereon. In some embodiments, the first substrate 201 is in a circular, quadrilateral or any other suitable shapes. In some embodiments, the first substrate 201 has a diameter of about 4 inches, 8 inches, 12 inches or any other suitable sizes.

In some embodiments, a protective layer 213 is disposed over the first surface 201a of the first substrate 201. In some embodiments, the protective layer 213 is configured to protect the first substrate 201 or other components disposed over or under the first substrate 201 from being removed during subsequent etching operations by an etchant such as hydrofluoric (HF) acid vapor. In some embodiments, the protective layer 213 includes aluminum oxide ($Al_2O_3$).

In some embodiments, several metallic structures 205 are disposed over the first surface 201a of the first substrate 201. In some embodiments, the metallic structures 205 are disposed over the protective layer 213. In some embodiments, the metallic structures 205 are bond pads configured to receive other conductive structures. In some embodiments, the metallic structure 205 includes conductive materials such as copper, aluminum, gold, etc.

In some embodiments, several conductive bumps 202 are disposed over the first surface 201a of the first substrate 201. In some embodiments, the conductive bumps 202 are disposed over the metallic structures 205. In some embodiments, the conductive bumps 202 are configured to electrically connect with other circuits or other conductive structures. In some embodiments, the conductive bumps 202 are coupled and electrically connected with metallic structures 205. In some embodiments, the conductive bumps 202 are configured to bond with external circuitries and electrically connect the metallic structures 205 with external circuitries.

In some embodiments, each conductive bump 202 has a height of less than about 1 um. In some embodiments, the height of the conductive bump 202 is about 0.5 um to about 5 um. In some embodiments, each conductive bump 202 has a width of a cross-sectional surface is about 2 um. In some embodiments, the width of the conductive bump 202 is about 1 um to about 5 um. In some embodiments, the conductive bumps 202 are formed by any suitable operations such as electroless plating, electroplating, etc. In some embodiments, the conductive bump 202 includes conductive materials such as copper, gold, nickel, solder, etc. In some embodiments, the conductive bump 202 can be in any suitable shapes such as hemispherical, conical, cylindrical, etc.

Figure 4B:
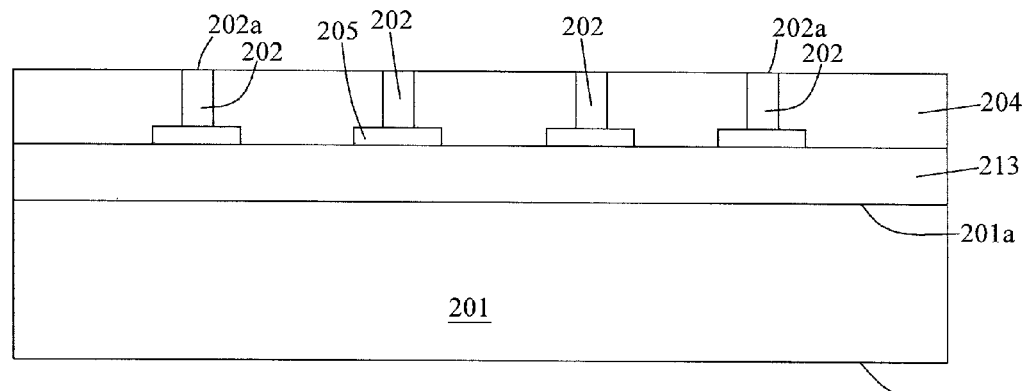
FIG. 4B is a schematic view of a first substrate with sacrificial material in accordance with some embodiments of the present disclosure.

In operation 902, a sacrificial material 204 is disposed over the first substrate 201 as shown in FIG. 4B. In some embodiments, the sacrificial material 204 is disposed over the protective layer 213 and surrounds the conductive bumps 202 and the metallic structures 205. In some embodiments, the sacrificial material 204 covers top surfaces 202a of the conductive bumps 202. In some embodiments, the top surfaces 202a of the conductive bumps 202 are exposed from the sacrificial material 204. In some embodiments, the sacrificial material 204 includes dielectric materials such as oxide, silicon oxide, tetraethyl orthosilicate (TEOS), etc. In some embodiments, the sacrificial material 204 is disposed by any suitable operations such as vapor deposition, spin coating, sputtering, etc.

Figure 4C:
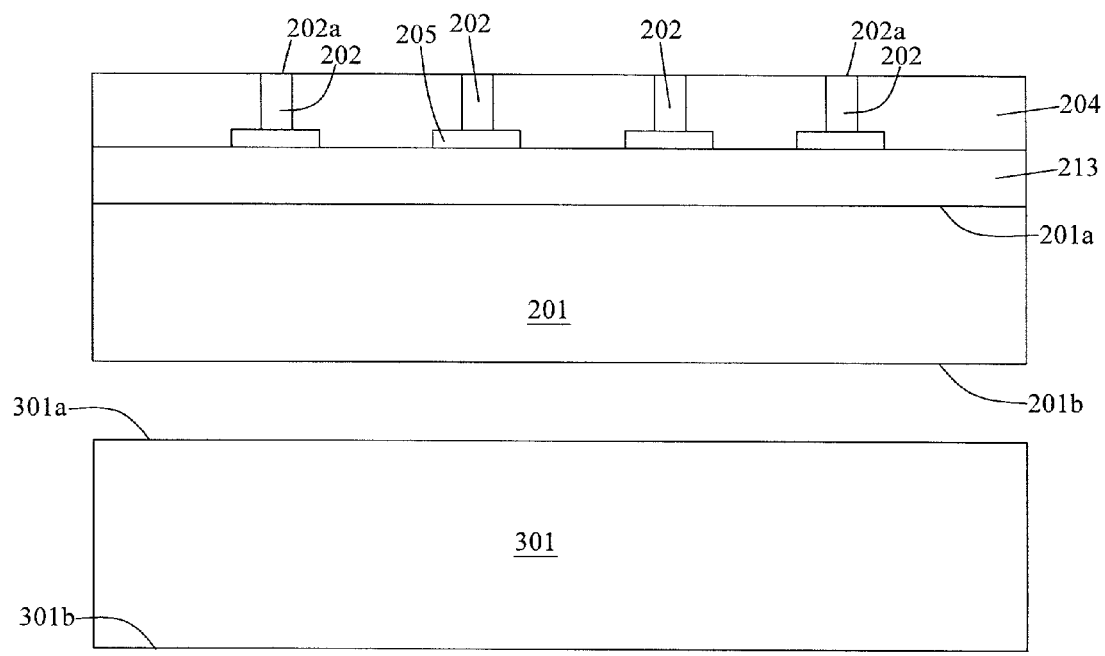
FIG. 4C is a schematic view of a first substrate and a second substrate in accordance with some embodiments of the present disclosure.

In operation 903, a second substrate 301 is received or provided as shown in FIG. 4C. In some embodiments, the second substrate 301 is a carrier substrate or handle wafer. In some embodiments, the second substrate 301 is configured for supporting another substrate or wafer in a small thickness. The second substrate 301 can provide a mechanical support to another substrate or wafer which would be subsequently processed by various operations. In some embodiments, the second substrate 301 includes a top surface 301a for facilitating a receipt of another substrate or wafer.

In some embodiments, the second substrate 301 includes silicon, glass, ceramic, etc. In some embodiments, the second substrate 301 is in a circular, quadrilateral, polygonal or any other suitable shapes. In some embodiments, the second substrate 301 has dimension and shape substantially same as the first substrate 201. In some embodiments, the second substrate 301 has a diameter substantially same as to diameter of the first substrate 201. In some embodiments, the diameter of the second substrate 301 is greater than the diameter of the first substrate 201. In some embodiments, the second substrate 301 has a thickness substantially greater than a thickness of the first substrate 201.

Figure 4D:
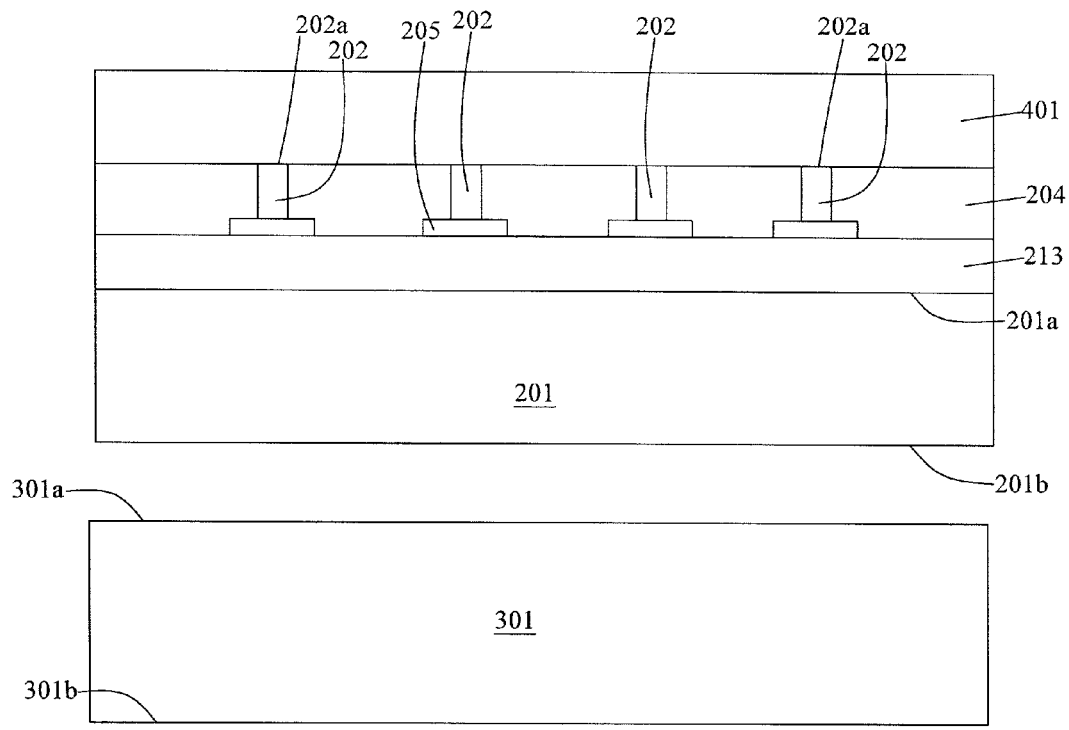
FIG. 4D is a schematic view of an adhesive disposed over a first substrate in accordance with some embodiments of the present disclosure.
Figure 4E:
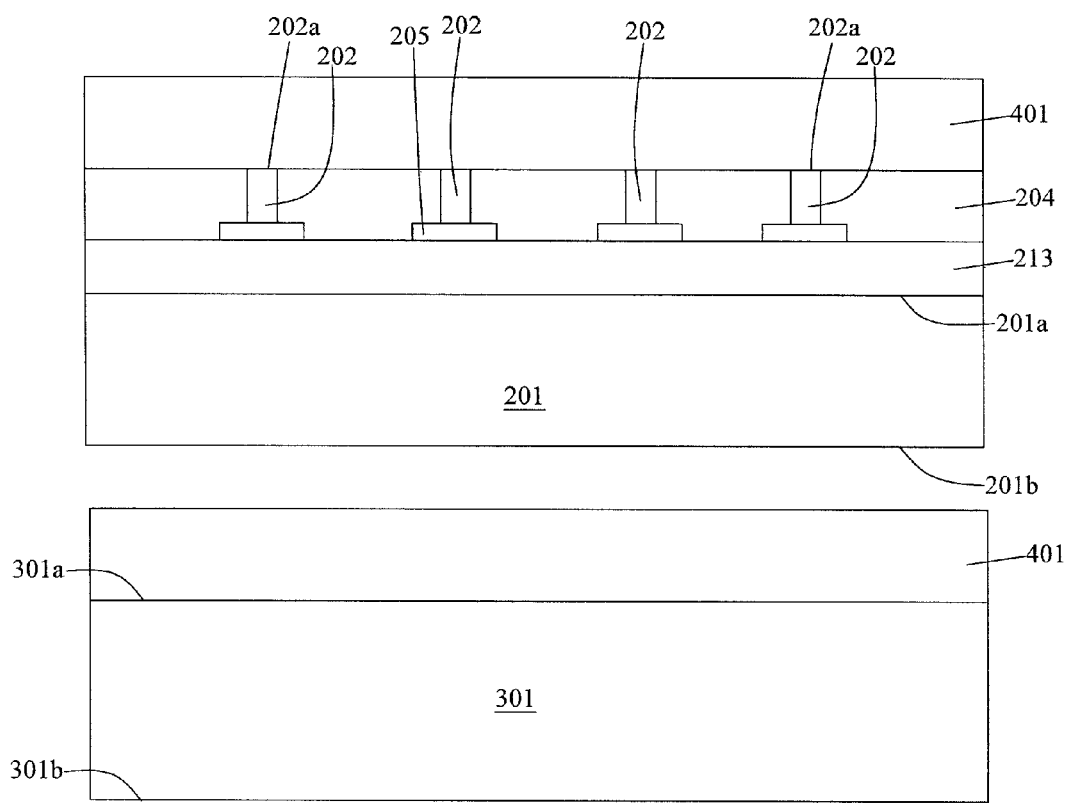
FIG. 4E is a schematic view of an adhesive disposed over a second substrate in accordance with some embodiments of the present disclosure.

In operation 904, an adhesive 401 is disposed over the first substrate 201 or the second substrate 301 as shown in FIGS. 4D and 4E. In some embodiments as shown in FIG. 4D, the adhesive 401 is disposed over the first surface 201a of the first substrate 201. In some embodiments, the adhesive 401 is uniformly disposed across the first substrate 201. In some embodiments, the adhesive 401 has a thickness of about 1 um to about 100 um. In some embodiments, the adhesive 401 includes polymeric material such as polymer, polyimide (PI), benzocyclobutene (BCB), etc. In some embodiments, a glue material or an adhesion promoter is disposed between the adhesive 401 and the first substrate 201. In some embodiments, the adhesive 401 is disposed over the first substrate 201 by any suitable operations such as spin coating, etc.

In some embodiments as shown in FIG. 4E, the adhesive 401 is disposed over the second substrate 301. In some embodiments, the adhesive 401 is disposed over the top surface 301a of the second substrate 301. In some embodiments, the adhesive 401 is uniformly disposed across the second substrate 301. In some embodiments, the adhesive 401 has a thickness of about 1 um to about 100 um. In some embodiments, the adhesive 401 includes polymeric material such as polymer, polyimide (PI), benzocyclobutene (BCB), etc. In some embodiments, a glue material or an adhesion promoter is disposed between the adhesive 401 and the second substrate 301. In some embodiments, the adhesive 401 is disposed over the second substrate 301 by any suitable operations such as spin coating, etc.

Figure 4F:
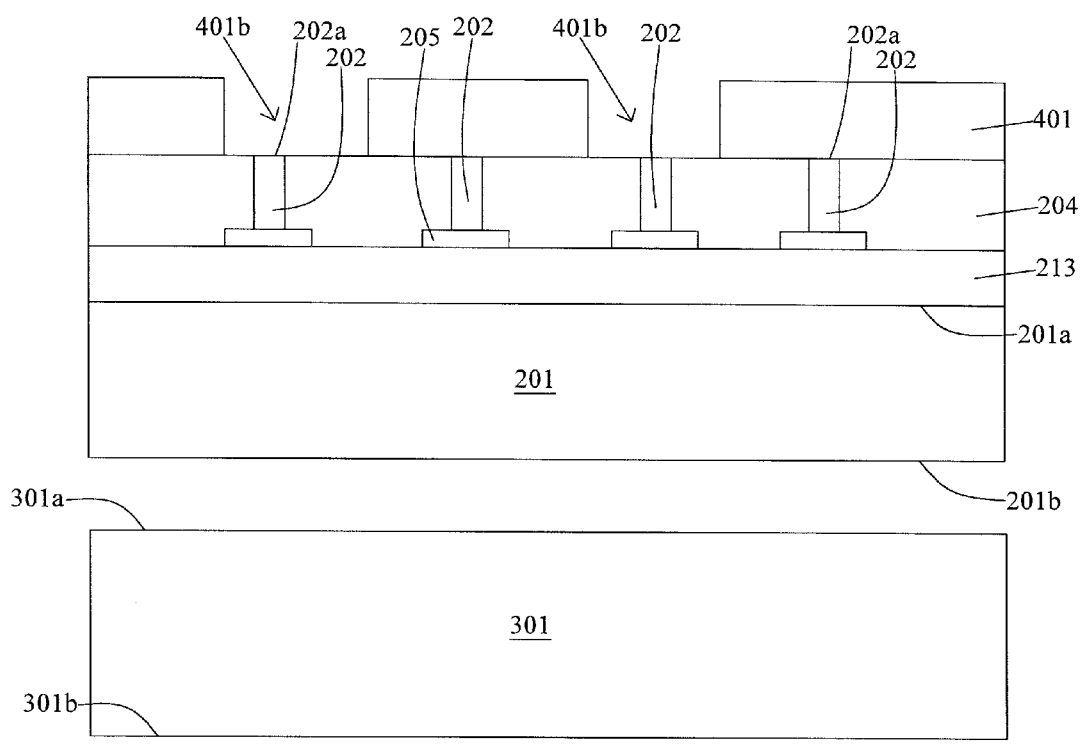
FIG. 4F is a schematic view of a patterned adhesive disposed over a first substrate in accordance with some embodiments of the present disclosure.
Figure 4G:
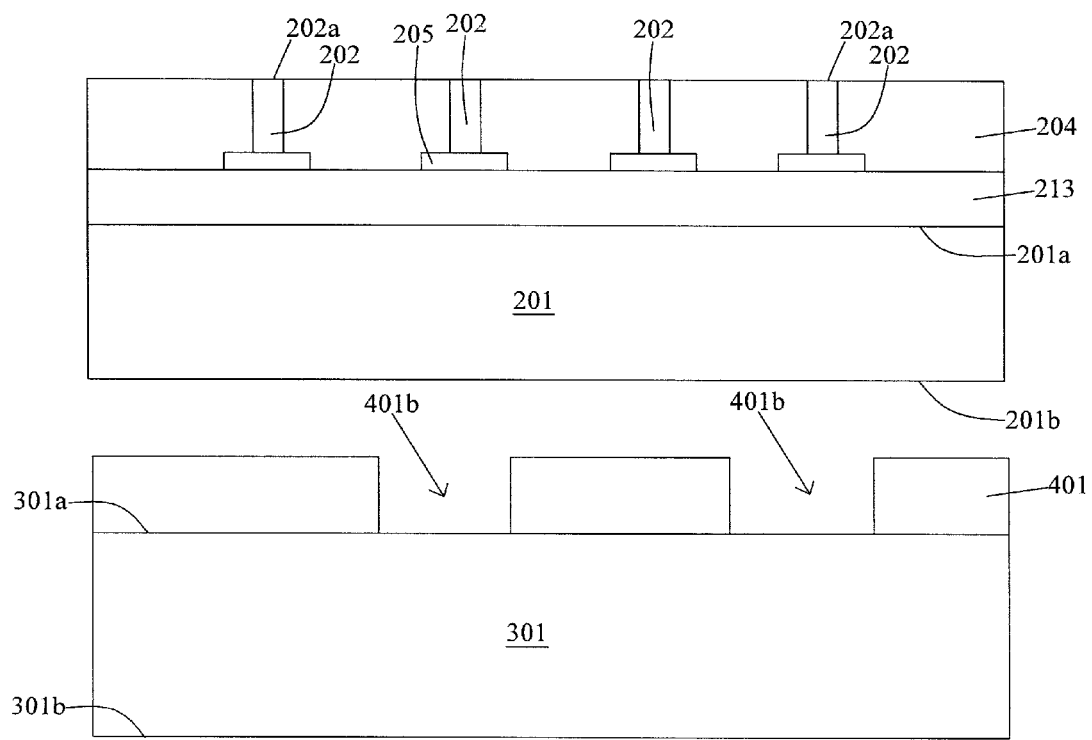
FIG. 4G is a schematic view of a patterned adhesive disposed over a second substrate in accordance with some embodiments of the present disclosure.
Figure 4H:
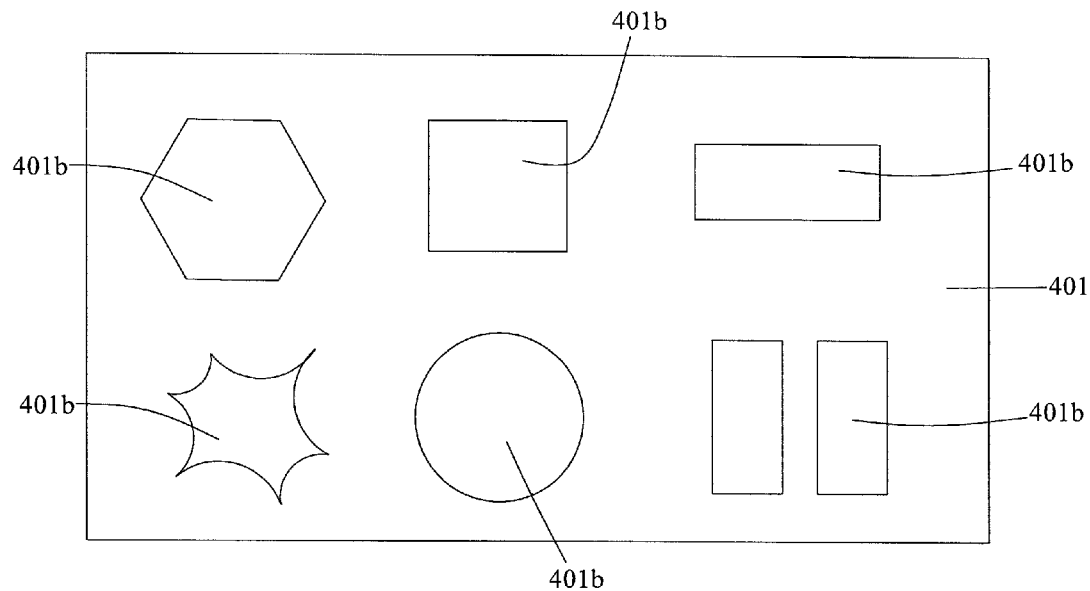
FIG. 4H is a schematic top view of a patterned adhesive in accordance with some embodiments of the present disclosure.

In operation 905, the adhesive 401 is patterned as shown in FIGS. 4F, 4G and 4H. In some embodiments as shown in FIG. 4F, the adhesive 401 is patterned by removing some portions of the adhesive 401, such that some of the sacrificial material 204 or some of top surfaces 202a of conductive bumps 202 are exposed from the adhesive 401. In some embodiments, as shown in FIG. 4G, the adhesive 401 is patterned to expose some of the second substrate 301. In some embodiments, the adhesive 401 is patterned by any suitable operations such as photolithography and etching. In some embodiments, a patterned photomask is disposed over the adhesive 401 and the adhesive 401 is exposed to an electromagnetic radiation. Those portions of the adhesive 401 without coverage of the photomask or portions of the adhesive 401 exposed to the electromagnetic radiation are removable by an etchant. Thus, several openings 401b are formed and the adhesive 401 with the pattern is formed. In some embodiments, the adhesive 401 can be patterned in any suitable dimensions or shapes as shown in FIG. 4H. In some embodiments, the opening 401b is in rectangular, quadrilateral, polygonal, triangular or any other shape.

In some embodiments, the adhesive 401 is heated in a first ambiance. In some embodiments, the adhesive 401 disposed over the first substrate 201 or the second substrate 301 is heated in the first ambiance. In some embodiments, the adhesive 401 is pre-cured or partially-cured under the first ambiance. In some embodiments, the first ambiance is at a temperature of about 100° C. to about 300° C. In some embodiments, the first ambiance is at a temperature of about 100° C. to about 400° C.

Figure 4I:
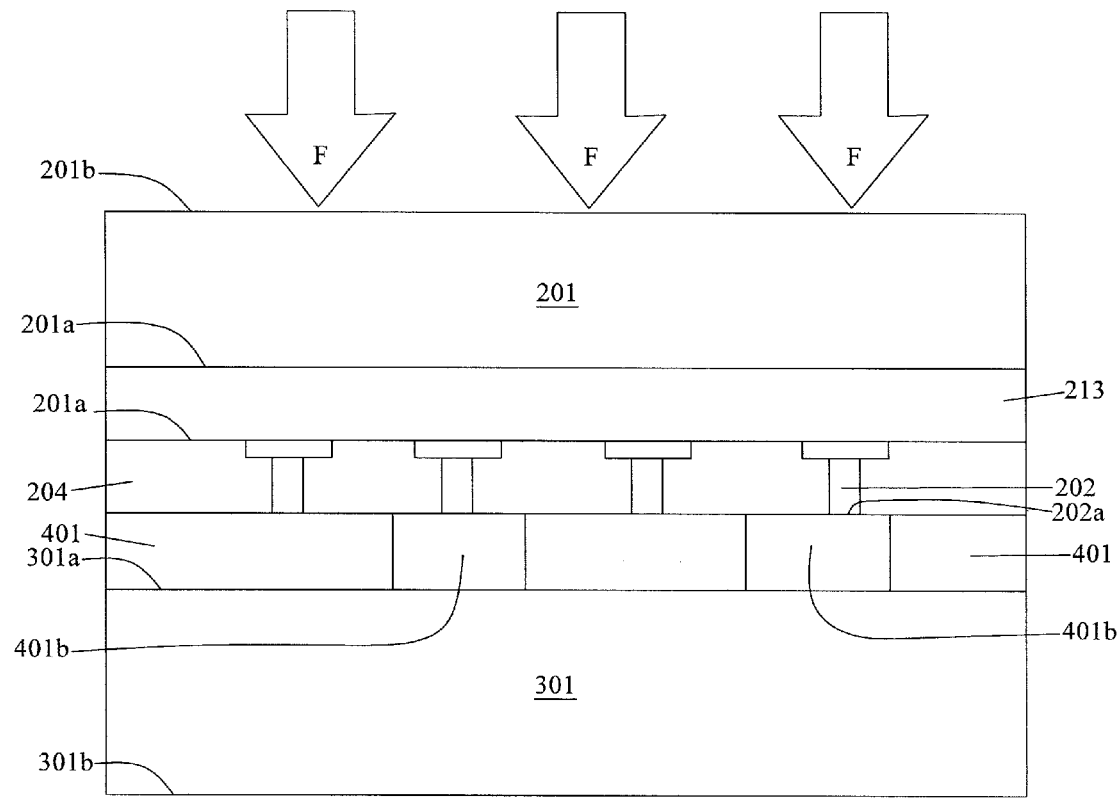
FIG. 4I is a schematic view of a first substrate bonded with a second substrate in accordance with some embodiments of the present disclosure.

In operation 906, the first substrate 201 is bonded with the second substrate 301 by the adhesive 401 as shown in FIG. 4I. In some embodiments, the first substrate 201 is temporarily bonded with the second substrate 301. In some embodiments, the first substrate 201 is flipped and bonded with the second substrate 301. In some embodiments, the first substrate 201 is bonded with the second substrate 301 by applying a force F upon the first substrate 201 or the second substrate 301. The force F presses the first substrate 201 towards the second substrate 301 or presses the second substrate 301 towards the first substrate 201. In some embodiments, the force F is applied on the second surface 201b of the first substrate 201 towards the second substrate 301 or applied on a bottom surface 301b of the second substrate 301 towards the first substrate 201, such that the first substrate 201 is bonded with the second substrate 301 by the adhesive 401.

In some embodiments, the force F of less than about 10,000N (10 KN) is applied on the second surface 201b of the first substrate 201 towards the second substrate 301 or applied on the bottom surface 301b of the second substrate 301 towards the first substrate 201. In some embodiments, both the first substrate 201 and the second substrate 301 are wafers respectively with a diameter of about 4 inches, 8 inches, 12 inches or any other suitable sizes.

In some embodiments, a duration of the application of the force F is less than about 10 minutes. In some embodiments, the duration of the application of the force F is about 5 minutes to about 30 minutes. In some embodiments, the duration is less than about 1 hour. In some embodiments, the adhesive 401 is heated in a second ambiance upon the bonding of the first substrate 201 and the second substrate 301. In some embodiments, the adhesive 401 is heated in the second ambiance of a temperature about 120° C. to about 250° C.

During the bonding of the first substrate 201 with the second substrate 301, the force F of less than about 10,000N is required to apply on the first substrate 201 or the second substrate 301, as the adhesive 401 is heated and pre-cured before the bonding, and is heated and post-cured after the bonding. In some embodiments, the first substrate 201 or the second substrate 301 has a diameter of about 12 inches, and the force F of less than about 10,000N is required to apply on the first substrate 201 or the second substrate 301 upon the bonding of the first substrate 201 with the second substrate 301. The first substrate 201 or the second substrate 301 is in a large size (such as about 12 inches) while the force F of less than about 10,000N is required for bonding, because the adhesive 401 undergoes heating before and after the bonding.

In some embodiments, the adhesive 401 is heated in a third ambiance to solidify the adhesive 401 after the bonding the first substrate 201 with the second substrate 301. In some embodiments, the adhesive 401 is heated and post-cured in the third ambiance of a temperature about 250° C. to about 400° C. In some embodiments, the adhesion promoter is disposed between the second substrate and the adhesive 401 or between the sacrificial material 204 and the adhesive 401, and thus the adhesive 401 is post-cured in the third ambiance after the bonding the first substrate 201 with the second substrate 301. If the glue material is disposed between the second substrate and the adhesive 401 or between the sacrificial material 204 and the adhesive 401, the heating of the adhesive 401 after the bonding may be not required.

Figure 4J:
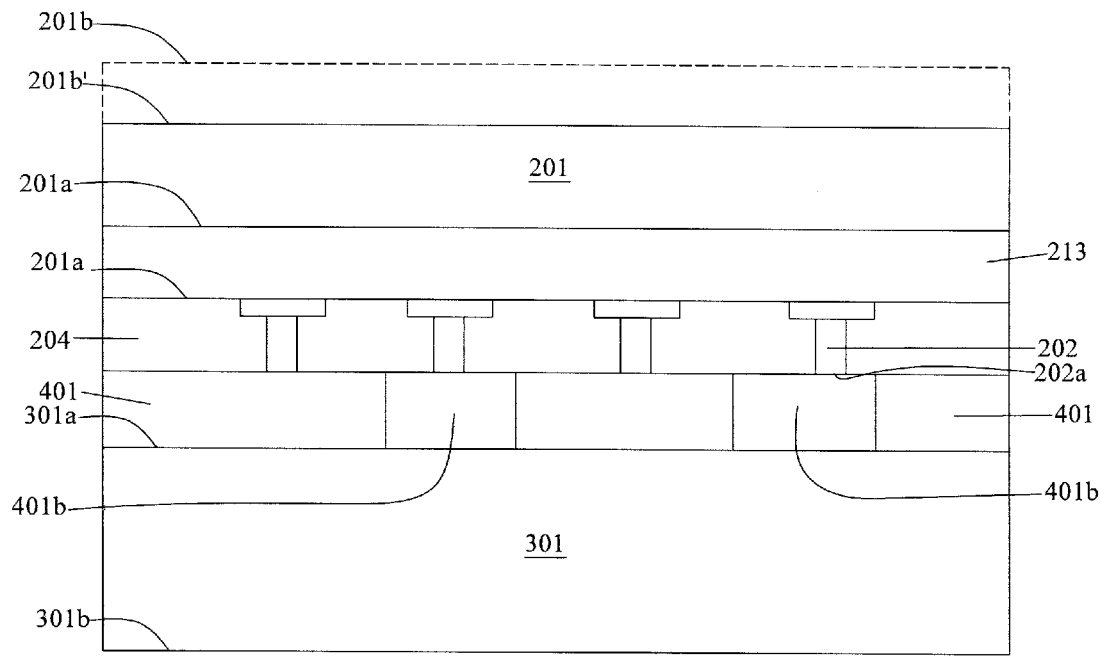
FIG. 4J is a schematic view of a thinned first substrate in accordance with some embodiments of the present disclosure.

In operation 907, the first substrate 201 or the second substrate 301 is thinned down as shown in FIG. 4J. In some embodiments, a thickness of the first substrate is thinned down from the second surface 201b. The second surface 201b becomes a new second surface 201b'. In some embodiments, a portion of the first substrate 201 is removed from the second surface 201b towards the first surface 201a. In some embodiments, some of the first substrate 201 is removed by any suitable operations such as grinding, etching, etc. In some embodiments, a torque or shear is applied over the second surface 201b of the first substrate 201 in order to remove the portion of the first substrate 201. In some embodiments, the thickness of the first substrate 201 is reduced to less than about 25 um after the thinning operations. In some embodiments, the thickness of the first substrate 201 is reduced to about 20 um to about 100 um after the thinning operations. In some embodiments, a thickness of the second substrate 301 is thinned down from a bottom surface 301b towards the top surface 301a of the second substrate 301. In some embodiments, a torque or shear is applied over the bottom surface 301b of the second substrate 301 in order to remove the portion of the second substrate 301.

In some embodiments, the first substrate 201 integrated with the second substrate 301 undergoes the thinning operations. The first substrate 201 is temporarily bonded with the second substrate 301 by the adhesive 401 upon the thinning operations. In some embodiments, the first substrate 201 is thinned down by mechanical grinding operations. For example, a grinder is used to remove some of the first substrate 201. In some embodiments, a grinding torque or shear is applied over the second surface 201b to remove some of the first substrate 201. In some embodiments, the grinding torque is substantially less than a bonding force between the sacrificial material 204 and the second substrate 301. In some embodiments, the bonding force is provided by the adhesive 401. In some embodiments, the bonding force is able to resist the grinding torque, so that the first substrate 201 and the sacrificial material 204 would not be detached from the second substrate 301 upon the thinning operations.

Figure 4K:
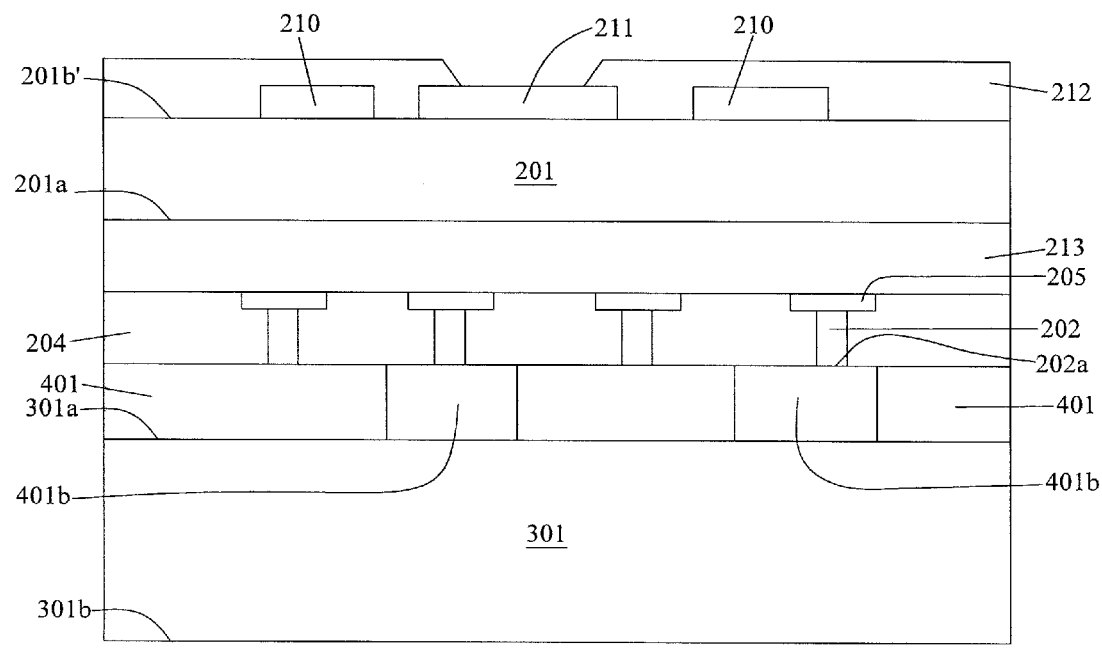
FIG. 4K is a schematic view of a redistribution layer and a conductive pad in accordance with some embodiments of the present disclosure.

In operation 908, a redistribution layer (RDL) 210, a conductive pad 211 and a passivation 212 are formed over the second surface 201b' of the first substrate 201 as shown in FIG. 4K. In some embodiment, the RDL 210 and the conductive pad 211 are formed over the second surface 201b'. In some embodiments, the RDL 210 re-routes a path of a circuit in the first substrate 201 from terminals to the conductive pad 211. In some embodiments, the conductive pad 211 is configured to receive other conductive structures such as metallic line, wirebond wiring, conductive bump, etc. In some embodiments, the RDL 210 and the conductive pad 211 include conductive materials such as gold, silver, copper, nickel, tungsten, aluminum, palladium and/or alloys thereof. In some embodiments, the RDL 210 and the conductive pad 211 are formed by any suitable operations such as electroplating. In some embodiments, the passivation 212 is disposed over the second surface 201b' to cover the RDL 210 and a portion of the conductive pad 211. In some embodiments, the conductive pad 211 is partially exposed from the passivation 212. In some embodiments, the passivation 212 includes dielectric materials such as silicon oxide, silicon oxynitride, silicon nitride, etc.

Figure 4L:
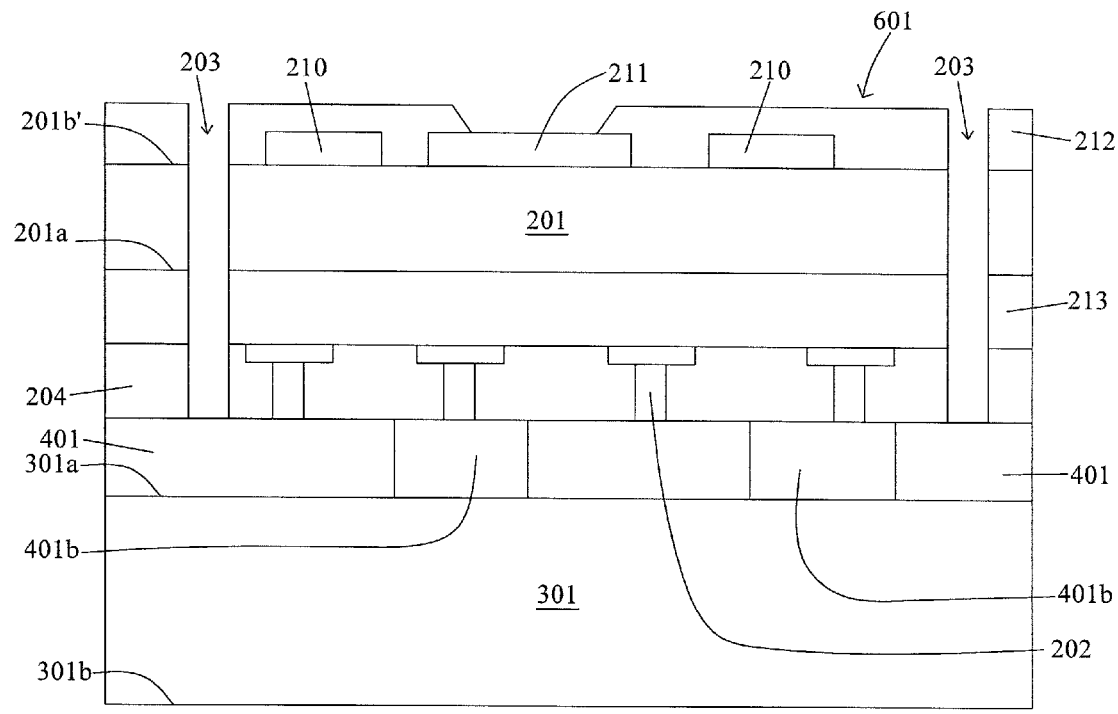
FIG. 4L is a schematic view of a chip singulated from a first substrate by a via in accordance with some embodiments of the present disclosure.
Figure 4M:
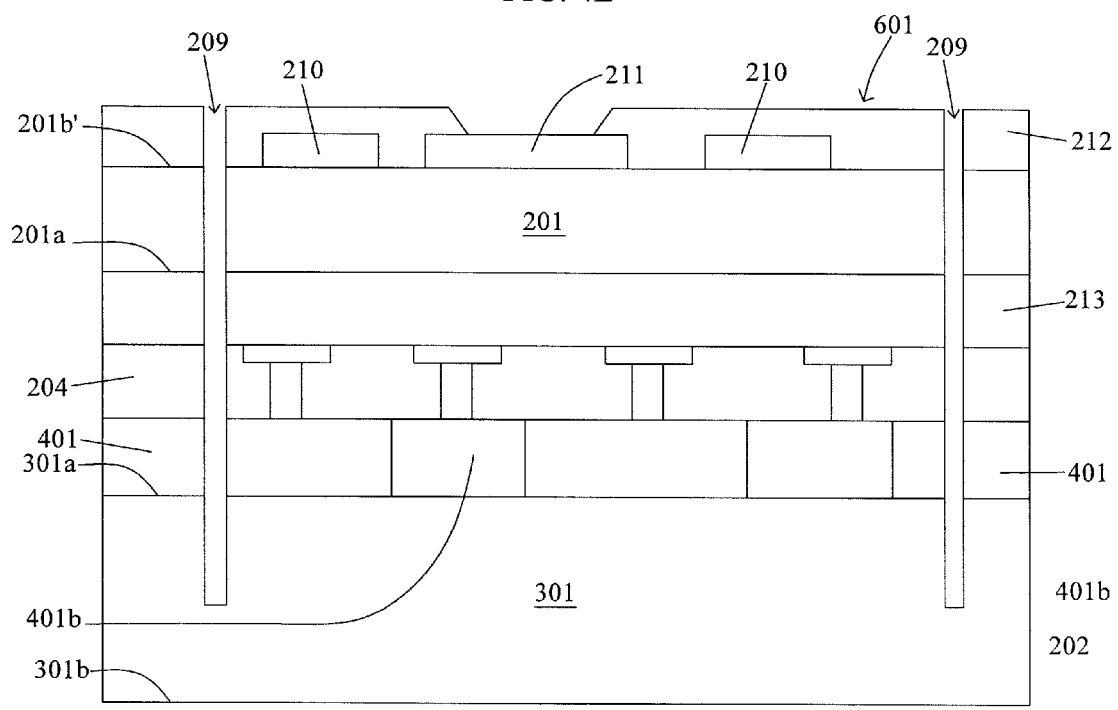
FIG. 4M is a schematic view of a chip singulated from a first substrate by a scribe line region in accordance with some embodiments of the present disclosure.
Figure 4N:
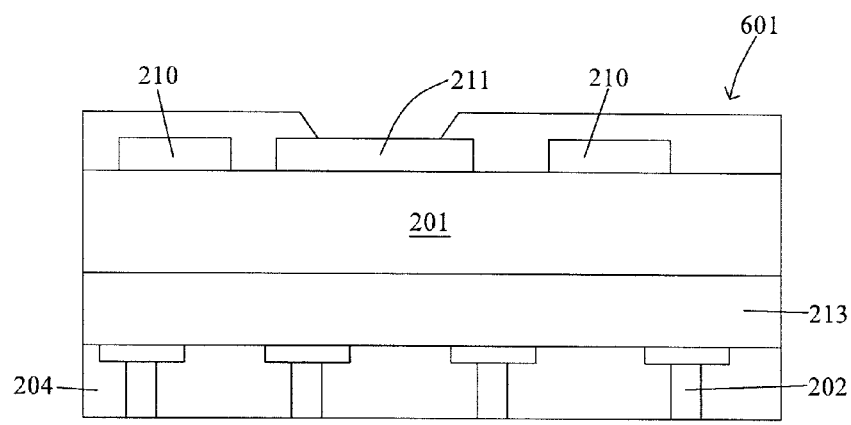
FIG. 4N is a schematic view of a chip separated from a second substrate in accordance with some embodiments of the present disclosure.

In operation 909, a chip 601 is singulated as shown in FIGS. 4L, 4M and 4N. In some embodiments as shown in FIG. 4L, the chip 601 is singulated by forming a via 203. In some embodiments, the via 203 partially saw the chip 601 out from the first substrate 201. In some embodiments, the via 203 passes through the passivation 212, the first substrate 201, the protective layer 213 and the sacrificial material 204. In some embodiments, the via 203 is extended from the passivation towards the adhesive 401. In some embodiments, the via 203 is a through silicon via (TSV). In some embodiments, the via 203 is formed by any suitable operations such as photolithography, etching, etc.

In some embodiments as shown in FIG. 4M, the chip 601 is singulated by sawing along a scribe line region 209. In some embodiments, the chip 601 is singulated by cutting through the passivation 212, the first substrate 201, the protective layer 213, the sacrificial material 204, the adhesive 401 and a part of the second substrate 301. In some embodiments, the chip 601 is singulated by forming a groove and cutting at the scribe line region 209. In some embodiments, the cutting at the scribe line region 209 is performed by any suitable means such as mechanical or laser blade.

Figure 4O:
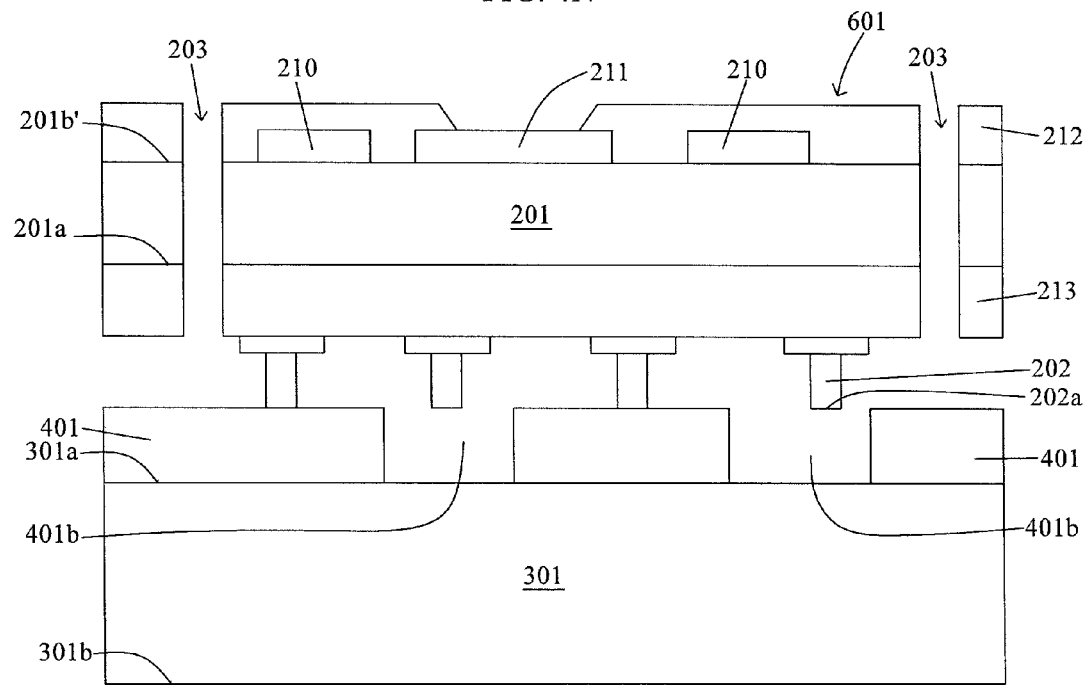
FIG. 4O is a schematic view of a chip singulated from a first substrate by a removal of a sacrificial material in accordance with some embodiments of the present disclosure.
Figure 4P:
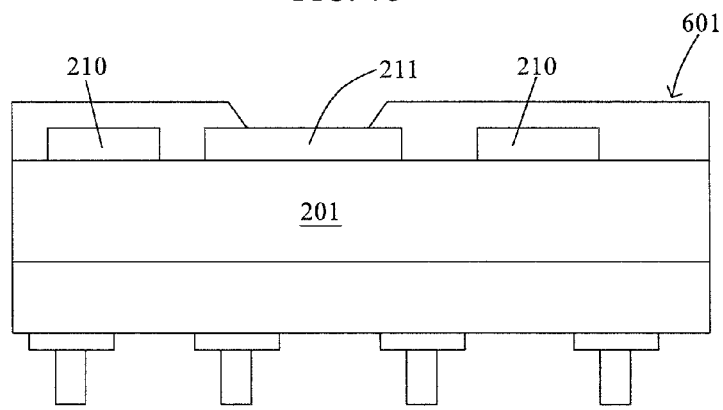
FIG. 4P is a schematic view of a chip separated from a second substrate in accordance with some embodiments of the present disclosure.

In operation 910, the chip 601 is separated from the second substrate 301 as shown in FIGS. 4N, 4O and 4P. After the singulation operations as shown in FIG. 4M, the chip 601 is separated and detached from the second substrate 301 as shown in FIG. 4N. In some embodiments, the chip 601 is sucked up from the second substrate 301 by an electrostatic force, so that the chip 601 is detached from the second substrate 301. In some embodiments, a bonding force between the adhesive 401 and the sacrificial material 204 is substantially smaller than a force (e.g. the electrostatic force) picking up the chip 601, and therefore the chip 601 can be separated from the adhesive 401 or the second substrate 301.

After the singulation operations as shown in FIG. 4L, the sacrificial material 204 is removed as shown in FIG. 4O and then the chip 601 is separated and detached from the second substrate 301 as shown in FIG. 4P. In some embodiments, the sacrificial material 204 is removed through the via 203. In some embodiments, the sacrificial material 204 is removed by any suitable operations such as etching. In some embodiments, After the removal of the sacrificial material 204, the conductive bumps 202 support the chip 601 over or on the adhesive 401. In some embodiments, some of top surfaces 202a of the conductive bumps 202 are coupled with the adhesive 401. In some embodiments, the chip 601 is sucked up from the second substrate 301 by an electrostatic force, so that the chip 601 is detached from the second substrate 301. In some embodiments, a bonding force between the adhesive 401 and the sacrificial material 204 is substantially smaller than a force (e.g. the electrostatic force) picking up the chip 601, and therefore the chip 601 can be separated from the adhesive 401 or the second substrate 301.

In the present disclosure, an improved method of manufacturing a semiconductor structure is disclosed. A first substrate (such as a device substrate) or a second substrate (such as a carrier substrate) disposed with an adhesive. The adhesive is pre-cured or partially cured before bonding the first substrate with the second substrate. Upon bonding, the adhesive is also heated. After bonding, the adhesive is post-cured. Such processes provide a permanent or temporary bonding of the first substrate and the second substrate, and such bonding can resist a thinning or grinding force upon the thinning operations and can prevent delamination of the first substrate from the second substrate during the thinning operations. The first substrate is readily separated from the second substrate after the thinning operations. Furthermore, the bonding operations is more efficient, less pressing force and shorter time are required for bonding the first substrate with the second substrate.

In some embodiments, a method of manufacturing a semiconductor structure, comprising receiving a first substrate including a first surface, a second surface opposite to the first surface and a plurality of conductive bumps disposed over the first surface; receiving a second substrate; disposing an adhesive over the first substrate or the second substrate; heating the adhesive in a first ambiance; bonding the first substrate with the second substrate by applying a force of less than about 10,000N upon the first substrate or the second substrate and heating the adhesive in a second ambiance; and thinning down a thickness of the first substrate from the second surface.

In some embodiments, the first ambiance is at a temperature of about 100° C. to about 300° C. In some embodiments, the second ambiance is at a temperature of about 120° C. to about 250° C. In some embodiments, the method further includes heating the adhesive in a third ambiance after the bonding the first substrate with the second substrate, and wherein the third ambiance is at a temperature of about 250° C. to about 400° C. In some embodiments, the bonding the first substrate with the second substrate includes assembling and integrating the first substrate and the second substrate, and the thinning down the thickness of the first substrate includes thinning the first substrate integrated with the second substrate. In some embodiments, a duration of the application of the force is less than about 10 minutes. In some embodiments, the thinning down the thickness of the first substrate includes removing some of the first substrate from the second surface towards the first surface, or reducing the thickness of the first substrate to about 20 um to about 100 um. In some embodiments, the plurality of conductive bumps are surrounded by the adhesive or an sacrificial material disposed between the first substrate and the adhesive.

In some embodiments, a method of manufacturing a semiconductor structure, comprising receiving a first substrate including a first surface, a second surface opposite to the first surface, a protective layer disposed over the first surface and a plurality of conductive bumps disposed over the protective layer; disposing a sacrificial material over the protective layer to surround the plurality of conductive bumps; receiving a second substrate; disposing an adhesive over the first substrate or the second substrate; patterning the adhesive; heating the adhesive in a first ambiance; bonding the first substrate with the second substrate by the adhesive and heating the adhesive in a second ambiance; thinning down a thickness of the first substrate or a thickness of the second substrate; singulating a plurality of chips from the first substrate; and separating one of the plurality of chips from the second substrate.

In some embodiments, the adhesive includes polymer, polyimide (PI), benzocyclobutene (BCB), a glue material or an adhesion promoter. In some embodiments, the singulating the plurality of chips includes sawing along a scribe line region through the first substrate, the protective layer, the sacrificial material, the adhesive and a part of the second substrate. In some embodiments, the patterning the adhesive includes forming a plurality of openings to expose some of the sacrificial material or some of conductive bumps. In some embodiments, the patterning the adhesive includes forming a plurality of openings to expose some of the second substrate. In some embodiments, the patterning the adhesive includes forming a plurality of openings in rectangular, quadrilateral or polygonal shapes. In some embodiments, the method includes forming a redistribution layer (RDL) or a conductive pad over the second surface of the second substrate. In some embodiments, the separating one of the plurality of chips includes sucking up one of the plurality of chips from the second substrate by an electrostatic force. In some embodiments, the adhesive is uniformly disposed across the first substrate and the second substrate. In some embodiments, the first substrate or the second substrate has a diameter of about 12 inches.

In some embodiments, A method of manufacturing a semiconductor structure, comprising: receiving a first substrate including a first surface and a second surface opposite to the first surface; receiving a second substrate; disposing an adhesive over the first substrate or the second substrate; patterning the adhesive; bonding the first substrate with the second substrate by the adhesive; and removing some portions of the first substrate from the second surface.

In some embodiments, the removing some portions of the first substrate includes applying a grinding torque over the second surface, and the grinding torque is substantially less than a bonding force between the second substrate and the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a first substrate including a plurality of conductive bumps disposed over the first substrate;
   receiving a second substrate;
   disposing an adhesive over the first substrate or the second substrate;
   removing a portion of the adhesive to expose a surface of the first substrate or a surface of the second substrate;
   heating the adhesive in a first ambiance;
   bonding the first substrate with the second substrate by applying a force of less than about 10,000N upon the first substrate or the second substrate and heating the adhesive in a second ambiance; and
   thinning down a thickness of the first substrate.

2. The method of claim 1, wherein the first ambiance is at a temperature of about 100° C. to about 300° C.

3. The method of claim 1, wherein the second ambiance is at a temperature of about 120° C. to about 250° C.

4. The method of claim 1, further comprising heating the adhesive in a third ambiance after the bonding the first substrate with the second substrate, and wherein the third ambiance is at a temperature of about 250° C. to about 400° C.

5. The method of claim 1, wherein the bonding the first substrate with the second substrate includes assembling and integrating the first substrate and the second substrate, and the thinning down the thickness of the first substrate includes thinning the first substrate integrated with the second substrate.

6. The method of claim 1, wherein a duration of the application of the force is less than about 10 minutes.

7. The method of claim 1, wherein the thinning down the thickness of the first substrate includes removing some of the first substrate, or reducing the thickness of the first substrate to about 20um to about 100um.

8. The method of claim 1, wherein the plurality of conductive bumps are surrounded by the adhesive or an sacrificial material disposed between the first substrate and the adhesive.

9. A method of manufacturing a semiconductor structure, comprising:
   receiving a first substrate including a first surface, a second surface opposite to the first surface, a protective layer disposed over the first surface and a plurality of conductive bumps disposed over the protective layer;
   disposing a sacrificial material over the protective layer to surround the plurality of conductive bumps;
   receiving a second substrate;
   disposing an adhesive over the first substrate or the second substrate;
   removing a portion of the adhesive to expose a portion of the sacrificial material;
   bonding the first substrate with the second substrate by the adhesive;
   thinning down a thickness of the first substrate or a thickness of the second substrate;
   singulating a plurality of chips from the first substrate; and
   separating one of the plurality of chips from the second substrate.

10. The method of claim 9, wherein the adhesive includes polymer, polyimide (PI), benzocyclobutene (BCB), a glue material or an adhesion promoter.

11. The method of claim 9, wherein the singulating the plurality of chips includes sawing along a scribe line region through the first substrate, the protective layer, the sacrificial material, the adhesive and a part of the second substrate.

12. The method of claim 9, wherein the removing the portion of the adhesive includes forming a plurality of openings to expose some of conductive bumps.

13. The method of claim 9, wherein the removing the portion of the adhesive includes forming a plurality of openings to expose some of the second substrate.

14. The method of claim 9, wherein the removing the portion of the adhesive includes forming a plurality of openings in rectangular, quadrilateral or polygonal shapes.

15. The method of claim 9, further comprising forming a redistribution layer (RDL) or a conductive pad over the second substrate.

16. The method of claim 9, wherein the separating one of the plurality of chips includes sucking up one of the plurality of chips from the second substrate by an electrostatic force.

17. The method of claim 9, wherein the adhesive is uniformly disposed across the first substrate and the second substrate.

18. The method of claim 9, wherein the first substrate or the second substrate has a diameter of about 12 inches.

19. A method of manufacturing a semiconductor structure, comprising:

receiving a first substrate including a conductive bump disposed over the first substrate;

receiving a second substrate;

disposing an adhesive over the first substrate and the conductive bump;

removing a portion of the adhesive to expose a surface of the first substrate and a surface of the conductive bump;

bonding the first substrate with the second substrate by the adhesive; and separating the first substrate from the adhesive and the second substrate.

20. The method of claim 19, further comprising applying a grinding torque over the first substrate or the second substrate, wherein the grinding torque is substantially less than a bonding force between the second substrate and the first substrate.

* * * * *